US012623463B2

(12) United States Patent
Kondo et al.

(10) Patent No.: US 12,623,463 B2
(45) Date of Patent: May 12, 2026

(54) PIEZOELECTRIC PUMP, LIQUID DISCHARGE HEAD, AND LIQUID DISCHARGE APPARATUS

(71) Applicant: CANON KABUSHIKI KAISHA, Tokyo (JP)

(72) Inventors: Soji Kondo, Kanagawa (JP); Masashi Ogawa, Kanagawa (JP); Kimiyuki Hayasaki, Kanagawa (JP); Naozumi Nabeshima, Tokyo (JP); Keiichiro Tsukuda, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 173 days.

(21) Appl. No.: 18/180,752

(22) Filed: Mar. 8, 2023

(65) Prior Publication Data

US 2023/0286273 A1      Sep. 14, 2023

(30) Foreign Application Priority Data

Mar. 14, 2022      (JP) ................................. 2022-038934

(51) Int. Cl.
| | |
|---|---|
| *B41J 2/175* | (2006.01) |
| *B41J 2/18* | (2006.01) |
| *B41J 29/38* | (2006.01) |
| *H10N 30/20* | (2023.01) |
| *H10N 30/88* | (2023.01) |

(52) U.S. Cl.
CPC ............. B41J 2/17596 (2013.01); B41J 2/18 (2013.01); *B41J 29/38* (2013.01); *H10N 30/2047* (2023.02); *H10N 30/886* (2023.02)

(58) Field of Classification Search
CPC ......................... B41J 2/14298; B41J 2/14233; B41J 2/17596; B41J 2/18; H10N 30/2047; H10N 30/886; F04B 43/046; F04B 45/047; F04B 43/043; F04B 43/14; F04B 43/04; F04B 17/003; F04B 45/10; F04B 19/006; F04B 43/095; F04B 43/09
See application file for complete search history.

(56) References Cited

U.S. PATENT DOCUMENTS

| | | | | |
|---|---|---|---|---|
| 6,007,189 A | * | 12/1999 | Yano | .................... B41J 2/14201 347/71 |
| 7,498,718 B2 | * | 3/2009 | Vogeley | ................ F04B 43/046 310/324 |
| 8,522,462 B2 | * | 9/2013 | Lukas | .................... D06F 75/14 38/77.8 |
| 8,721,060 B2 | * | 5/2014 | Yokoyama | ............... B41J 2/175 347/89 |

(Continued)

FOREIGN PATENT DOCUMENTS

| | | | | | |
|---|---|---|---|---|---|
| JP | 06183024 A | * | 7/1994 | ............. | B41J 2/175 |
| JP | 2008180161 A | | 8/2008 | | |
| JP | 2008180179 A | | 8/2008 | | |

(Continued)

*Primary Examiner* — Geoffrey S Mruk

(74) *Attorney, Agent, or Firm* — Canon U.S.A., Inc. IP Division

(57) ABSTRACT

A piezoelectric pump, for causing the flow of a liquid, including a piezoelectric member driven by applying a voltage, a diaphragm which is deformed by the driving of the piezoelectric member, an adhesive member which bonds the piezoelectric member and the diaphragm together, and an urging member that urges the piezoelectric member toward the diaphragm.

17 Claims, 27 Drawing Sheets

(56)                   References Cited

U.S. PATENT DOCUMENTS 9,205,665  B2 *  12/2015  Kaneko ................. F04B 43/046
9,616,673  B2 *   4/2017  Domae ...................... B41J 2/18

FOREIGN PATENT DOCUMENTS

JP          2009041554  A     2/2009
JP          2009121242  A     6/2009
JP          2019064254  A     4/2019
JP          2020133505  A     8/2020

* cited by examiner

FIG. 1A    FIG. 1B    FIG. 1C
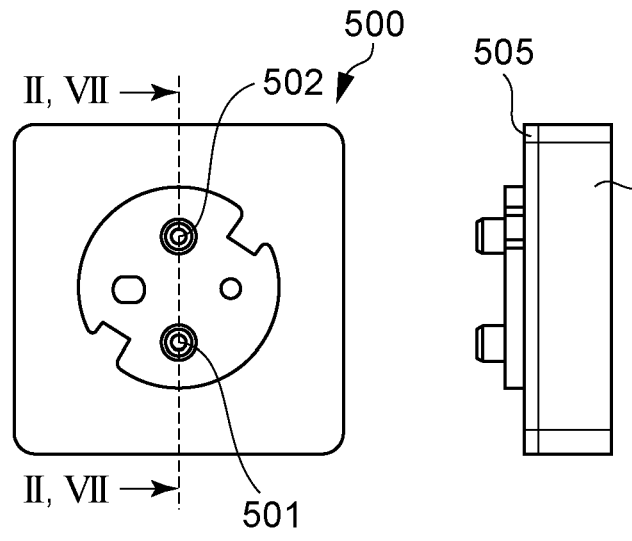
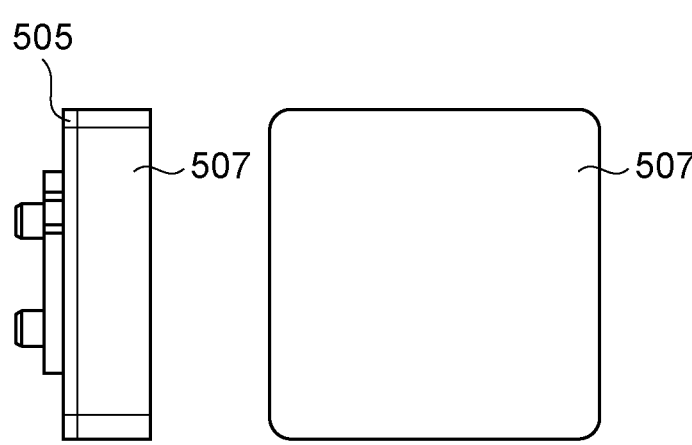

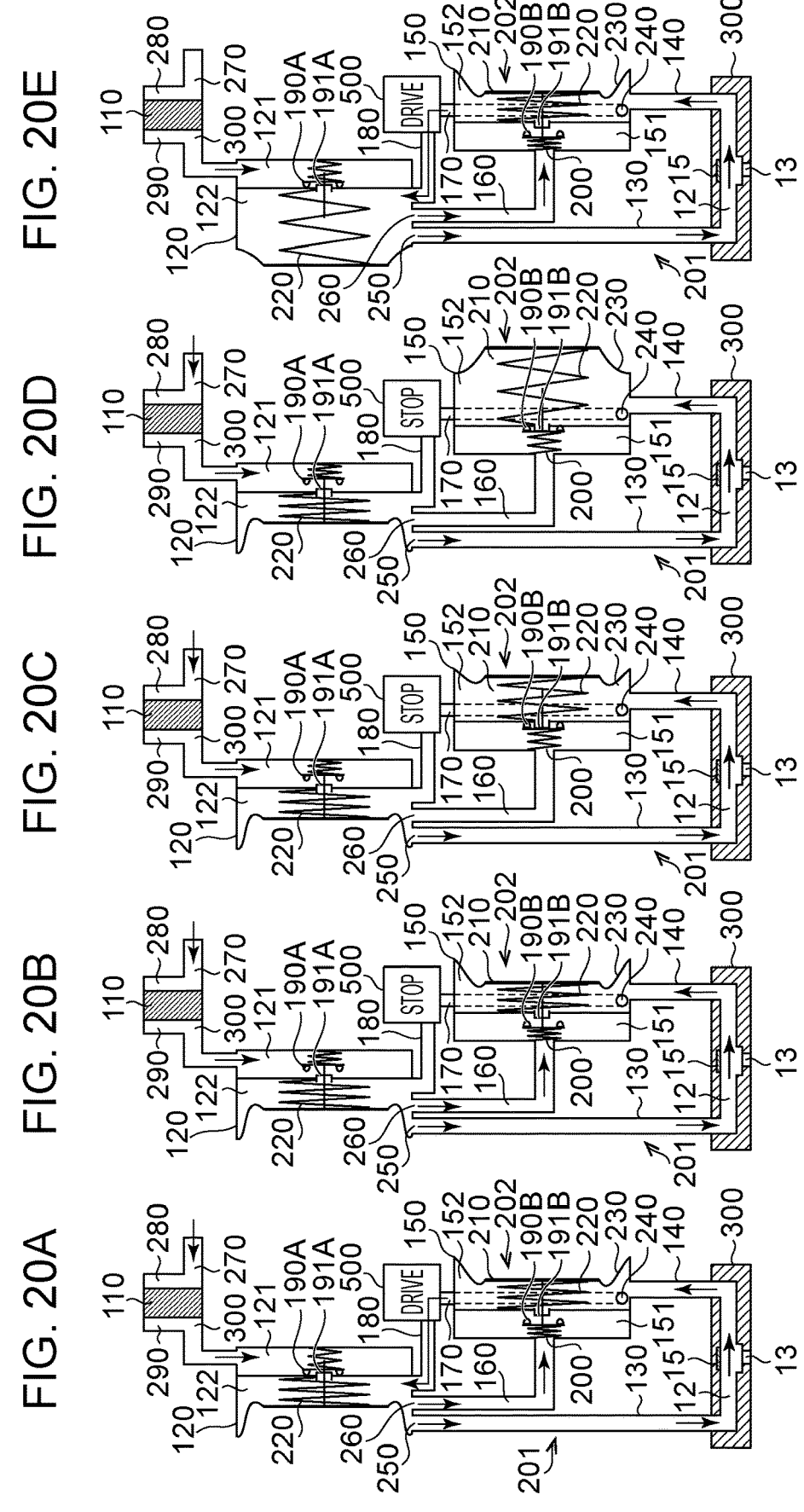

FIG. 23

SCANNING DIRECTION

SCANNING DIRECTION

X

SCANNING DIRECTION

X

SCANNING DIRECTION

FIG. 27

PIEZOELECTRIC PUMP, LIQUID DISCHARGE HEAD, AND LIQUID DISCHARGE APPARATUS

BACKGROUND

Field of the Disclosure

The present disclosure relates to piezoelectric pumps, liquid discharge heads, and liquid discharge apparatuses.

Description of the Related Art

Piezoelectric pumps in the related art are known to function as pumps in which application of a voltage to a piezoelectric actuator in which a piezoelectric member is fixed to a metal plate causes vibration in the piezoelectric actuator, and the vibration is transmitted to a diaphragm. For example, Japanese Patent Laid-Open No. 2008-180161 discloses a piezoelectric pump in which a metal plate is bonded to a diaphragm with an adhesive.

In the field of ink-jet printers, some liquid discharge apparatuses circulate liquid in a liquid discharge head to prevent ink thickening in the vicinity of discharge ports. For example, a known liquid discharge apparatus is equipped with a piezoelectric pump in the liquid discharge head to circulate the ink in the liquid discharge head. Integrating the liquid discharge head and the piezoelectric pump for circulating the ink allows reduction in the size of the liquid discharge apparatus.

However, if the piezoelectric pump disclosed in Japanese Patent Laid-Open No. 2008-180161 is installed in, for example, a liquid discharge apparatus, the adhesive interface of the adhesive that bonds the diaphragm and the metal plate together can be separated. Even if the diaphragm is bonded to the piezoelectric member without using the metal plate, the adhesive interface can be separated. This is because the adhesive and, for example, ink, are separated by the diaphragm, but the ink component may pass through the diaphragm into the adhesive interface between the diaphragm and the metal plate or the piezoelectric member. The intrusion of the ink component into the adhesive interface separates the adhesive interface, making the displacement of the piezoelectric member less prone to be transmitted to the diaphragm. This may decrease the flow rate of the circulating ink, causing discharge failure due to the ink thickening in the vicinity of the nozzles.

SUMMARY

The present disclosure provides a piezoelectric pump in which separation of the adhesive interface of an adhesive that bonds a metal plate or a piezoelectric member and a diaphragm together can be prevented, and a liquid discharge head and a liquid discharge apparatus including such a piezoelectric pump.

A piezoelectric pump according to a first aspect of the present disclosure is configured to make liquid flow. The piezoelectric pump includes a piezoelectric member driven by application of a voltage, a diaphragm deformed by driving of the piezoelectric member, an adhesive member bonding the piezoelectric member and the diaphragm together, and an urging member that urges the piezoelectric member toward the diaphragm.

A piezoelectric pump according to a second aspect of the present disclosure is configured to make liquid flow. The piezoelectric pump includes a piezoelectric member driven by application of a voltage, a metal plate fixed to the piezoelectric member, a diaphragm deformed by driving of the piezoelectric member, an adhesive member bonding the metal plate and the diaphragm together, and an urging member that urges the metal plate toward the diaphragm.

Further features of the present disclosure will become apparent from the following description of embodiments with reference to the attached drawings.

BRIEF DESCRIPTION OF THE DRAWINGS

FIG. 1A is a front view of a piezoelectric pump of a first embodiment.

FIG. 1B is a side view of the piezoelectric pump.

FIG. 1C is a back view of the piezoelectric pump.

FIG. 13A is a schematic diagram of a liquid discharge apparatus.

FIG. 14 is an exploded perspective view of the liquid discharge head.

FIG. 20A is a schematic diagram illustrating an ink flow during a recording operation.

FIG. 20B is a schematic diagram illustrating an ink flow immediately after the piezoelectric pump is stopped.

FIG. 20C is a schematic diagram illustrating an ink flow when a second valve chamber and a second pressure control chamber are in a noncommunicating state.

FIG. 20D is a schematic diagram illustrating an ink flow from a collecting channel to the second pressure control chamber.

FIG. 20E is a schematic diagram illustrating an ink flow when a first pressure control chamber is expanded.

FIG. 23 is a diagram illustrating a discharge element substrate.

FIG. 27 is a diagram of a discharge element substrate of a comparative example.

DESCRIPTION OF THE EMBODIMENTS

Embodiments of the present disclosure will be described hereinbelow with reference to the drawings. It is to be understood that the following embodiments do not limit the present disclosure and that not all the combinations of the features described in the embodiments are absolutely necessary for the solution of the present disclosure. Like components are denoted by like reference signs. In the following description, the configuration of a piezoelectric pump, which is a feature of the present disclosure, will be first described, and next, a liquid discharge head and a liquid discharge apparatus will be described.

First Embodiment

Piezoelectric Pump

FIGS. 1A to 1C are schematic diagrams of a piezoelectric pump 500. FIG. 1A is a front view of the piezoelectric pump 500. FIG. 1B is a side view of the piezoelectric pump 500. FIG. 1C is a back view of the piezoelectric pump 500. The piezoelectric pump 500 has a supply port 501 for supplying liquid to the piezoelectric pump 501 at the lower part. The piezoelectric pump 500 has a discharge port 502 for discharging liquid from the piezoelectric pump 500 at the upper part. In other words, the liquid entering through the supply port 501 passes through the piezoelectric pump 500 and is discharged through the discharge port 502.

Figure 17:
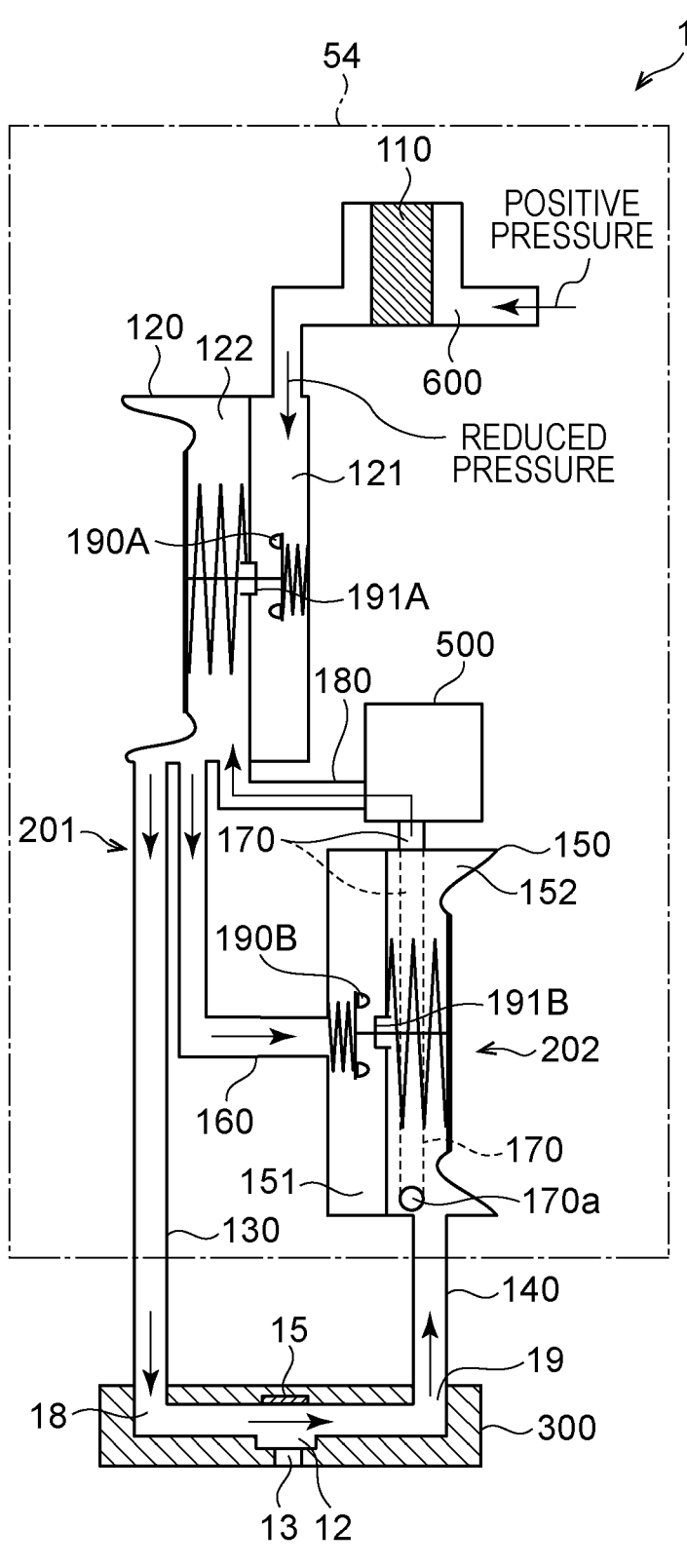
FIG. 17 is a longitudinal cross-sectional view of a circulation path.

As will be described below, in in the case where the piezoelectric pump 500 is installed in a liquid discharge apparatus, the supply port 501 is connected to a pump inlet channel 170 (FIG. 17), and the ink collected through a collecting channel 140 (FIG. 17) is supplied to the piezoelectric pump 500 through the pump inlet channel 170. The discharge port 502 is connected to a pump outlet channel 180 (FIG. 17), and the ink discharged to the pump outlet channel 180 is supplied to a supply channel 130 (FIG. 17).

Figure 2:
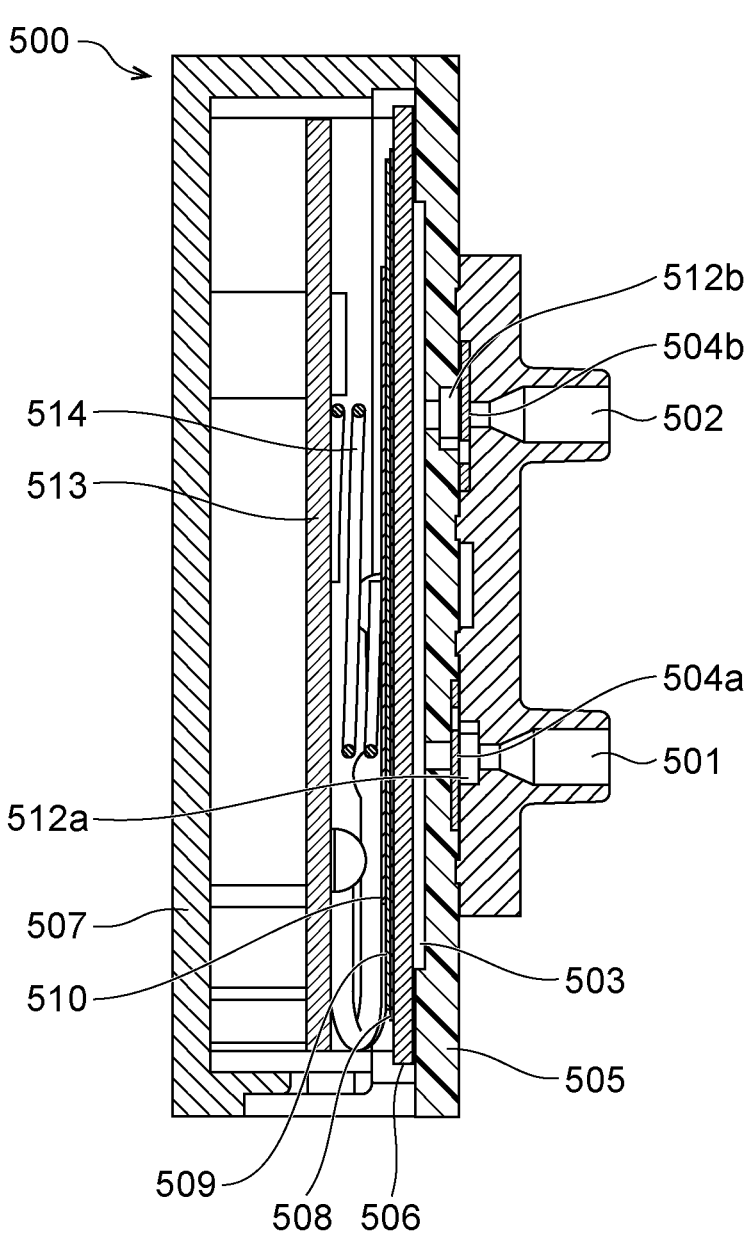
FIG. 2 is a cross-sectional view of the piezoelectric pump.

FIG. 2 is a cross-sectional view of the piezoelectric pump 500 taken along line II-II in FIG. 1A. The piezoelectric pump 500 contains a pump chamber 503, check valves 504a and 504b, a supporting member 505, a diaphragm 506, an adhesive 508, a metal plate 509, and a piezoelectric member 510. The diaphragm 506 is supported by the supporting member 505. The pump chamber 503 is a space enclosed by the supporting member 505 and the diaphragm 506 and communicates with the supply port 501 and the discharge port 502. The piezoelectric pump 500 is a pump that makes liquid flow by deforming the diaphragm 506 by the driving of the piezoelectric member 510 subjected to a voltage.

A check valve 504a is provided between the supply port 501 and the pump chamber 503 (communicating portion). A check valve 504b is provided between the pump chamber 503 and the discharge port 502 (a communicating portion). Specifically, the check valve 504a is disposed in a space 512a in the supply port 501 so as to be movable to the left in the drawing. The check valve 504b is disposed in a space 512b in the discharge port 502 so as to be movable to the right in the drawing.

When the diaphragm 506 is displaced to increase the capacity of the pump chamber 503, thereby decreasing the pressure in the pump chamber 503, the check valve 504a is separated from the opening of the supply port 501 in the space 512a (that is, moves to the left in the drawing). The separation of the check valve 504a from the opening of the pump supply port 501 in the space 512a causes the pump supply port 501 to open so that the ink can circulate. When the diaphragm 506 is displaced to decrease the capacity of the pump chamber 503, thereby increasing the pressure in the pump chamber 503, the check valve 504a comes into close-contact with the peripheral wall of the opening of the supply port 501. This causes the pump supply port 501 to be closed so that the circulation of the ink is blocked.

In contrast, when the pump chamber 503 is decompressed, the check valve 504b comes into close-contact with the peripheral wall of the opening of the supporting member 505 to close the discharge port 502 so that the circulation of the ink is blocked. When the pump chamber 503 is increased in pressure, the check valve 504b is separated from the opening of the supporting member 505 to move toward the space 512b (that is, to the right in the drawing), thereby enabling circulation of the ink through the discharge port 502.

The material for the check valves 504a and 504b may be deformable in response to the pressure in the pump chamber 503. Examples include, but are not limited to, elastic members, such as ethylene propylene diene monomer (EPDM) and elastomer, and a polypropylene film or thin sheet.

The pump chamber 503 is formed by joining the supporting member 505 and the diaphragm 506, as described above. Accordingly, the pressure in the pump chamber 503 is changed by deformation of the diaphragm 506. For example, when the diaphragm 506 is displaced toward the supporting member 505 (to the right in the drawing) to decrease the capacity of the pump chamber 503, the pressure in the pump chamber 503 increases. This causes the check valve 504b opposed to the discharge port 502 to be opened, thereby discharging the ink in the pump chamber 503. At that time, the check valve 504a opposed to the supply port 501 comes into close-contact with the peripheral wall of the pump supply port 501, thereby preventing the ink from flowing from the pump chamber 503 back to the supply port 501.

In contrast, when the diaphragm 506 is displaced in the direction in which the pump chamber 503 expands, the pressure in the pump chamber 503 decreases. This causes the check valve 504a opposed to the supply port 501 to be opened, thereby supplying the ink to the pump chamber 503. At that time, the check valve 504b disposed at the discharge port 502 comes into close-contact with the peripheral wall of the opening of the supporting member 505 to close the opening. This prevents the ink from flowing from the discharge port 502 back to the pump chamber 503.

Thus, the piezoelectric pump 500 sucks and discharges liquid by deforming the diaphragm 506 to change the pressure in the pump chamber 503. However, even if the diaphragm 506 is deformed, entrainment of bubbles in the pump chamber 503 decreases the pressure change in the pump chamber 503 because of expansion and contraction of the bubbles. The decrease in pressure change reduces the amount of liquid sucked and discharged.

Accordingly, to facilitate gathering the bubbles to the upper part of the pump chamber 503, the pump chamber 503 may be extended in the vertical direction when the piezoelectric pump 500 is in use. The vertical direction in this embodiment may be at any angle at which bubbles can gather to the upper part of the pump chamber 503. The term "in use" refers to a state in which the piezoelectric pump 500 is used to serve as a pump. The discharge port 502 may be disposed above the supply port 501 to discharge the bubbles in the pump chamber 503. The discharge port 502 may be disposed above the center of the pump chamber 503 in the vertical direction to facilitate discharging the bubbles through the discharge port 502. This allows stabilization of the flow rate of the piezoelectric pump 500.

Figures 3A, 3B:
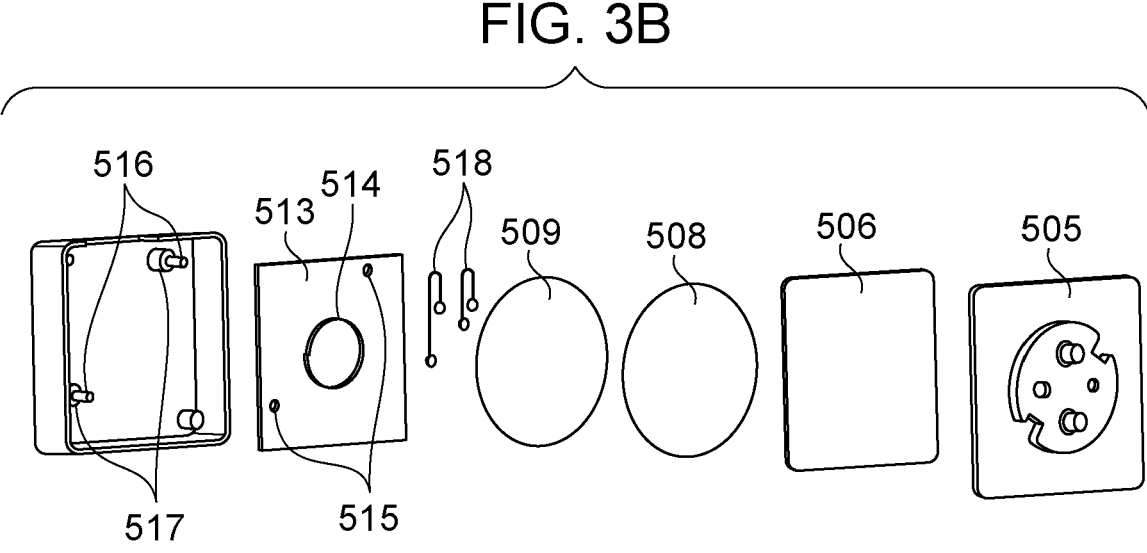
FIG. 3A is an exploded perspective view of the drive unit of the piezoelectric pump seen from the back.
FIG. 3B is an exploded perspective view of the drive unit of the piezoelectric pump seen from the front.

Next, a driving unit for deforming the diaphragm 506 will be described with reference to FIGS. 3A and 3B and FIG. 4. FIGS. 3A and 3B are exploded perspective views of the piezoelectric pump 500. FIG. 3A is a diagram of the piezoelectric pump 500 seen from a cover 507. FIG. 3B is a diagram of the piezoelectric pump 500 seen from the supporting member 505. The piezoelectric pump 500 makes liquid flow by deforming the diaphragm 506 using the deformation of the piezoelectric member 510 caused by application of a voltage to the piezoelectric member 510.

The metal plate 509 and the diaphragm 506 are bonded together with the adhesive 508, as shown in FIGS. 2 and 3A. The metal plate 509 is fixed to the piezoelectric member 510 with, for example, an adhesive (not shown). In this embodiment, the metal plate 509 and the diaphragm 506 are bonded with the adhesive 508. The adhesive 508 may be an adhesive member such as tape. The adhesive 508 may be any adhesive member whose adhesive interface may be separated by exudation of liquid to the adhesive interface.

The diaphragm 506 is a vibrating film that separates the liquid flowing in the pump chamber 503 from the metal plate 509 or the piezoelectric member 510. The diaphragm 506 is made of an injection-moldable material, such as denatured-polyphenyleether (PPE)+polystyrene (PS) or polypropylene, or a punched film or resin plate. The diaphragm 506 may be in a single layer or multiple layers.

Example materials for the metal plate 509 include, but are not limited to, brass, stainless steel, and an iron-nickel alloy. A drive circuit board 513 is opposed to the piezoelectric member 510. The drive circuit board 513 is supplied with electricity from an electrical power supply (not shown) to apply a voltage to the piezoelectric member 510 and the metal plate 509.

Figure 4:
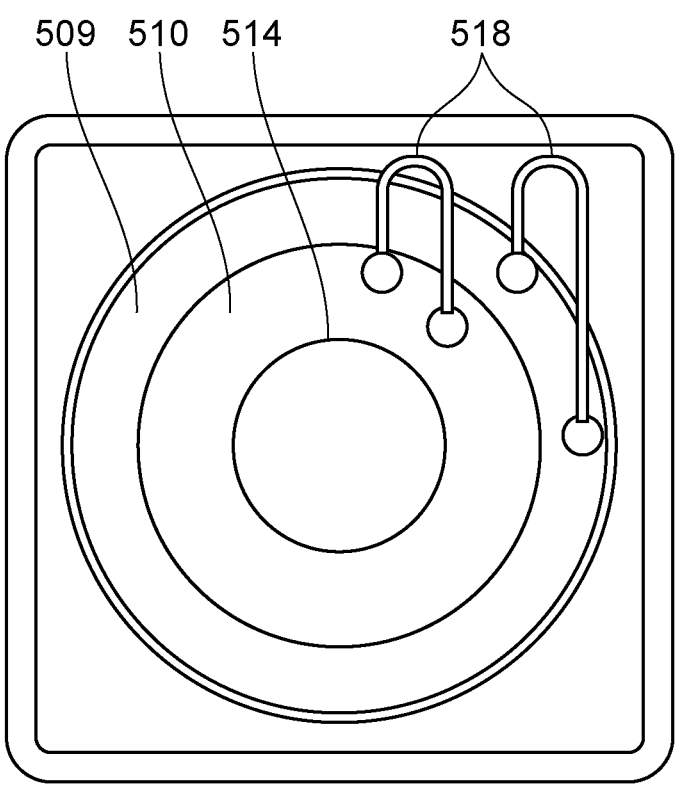
FIG. 4 is a perspective view of the drive unit of the piezoelectric pump.

FIG. 4 is a diagram of the electrical connection of the piezoelectric member 510 seen from the drive circuit board 513 through the drive circuit board 513. The drive circuit board 513 and the piezoelectric member 510 and the metal plate 509 are electrically connected with electrical connection cables 518. The electrical connection cables 518 and the drive circuit board 513 are fixed and electrically connected with solder 521 (FIG. 3A). The electrical connection cables 518 and the piezoelectric member 510 and the metal plate 509 are fixed and electrically connected with solder 520. The metal plate 509 is connected to the ground (GND) wiring line of the drive circuit board 513 with the electrical connection cable 518. The piezoelectric member 510 is connected to an alternating-current output unit of the drive circuit board 513 with the electrical connection cable 518. The piezoelectric member 510 is driven to deform the diaphragm 506 by connecting the metal plate 509 to the GND and applying an alternating-current voltage to the piezoelectric member 510. This causes the pressure in the pump chamber 503 to change, thereby making the liquid flow.

The diaphragm 506 is a vibrating film that separates the liquid flowing in the pump chamber 503 from the metal plate 509 or the piezoelectric member 510, as described above. However, if the liquid flowing in the pump chamber 503 is ink, its ink component can pass through the diaphragm 506 into the adhesive interface between the diaphragm 506 and the metal plate 509 or the piezoelectric member 510. The intrusion of the ink component to the adhesive interface may cause separation of the adhesive interface due to breakage of the chemical bond of the adhesive component in the adhesive due to the ink component and a stress generated when the adhesive absorbs moisture to swell.

For this reason, the embodiment of the present disclosure includes an urging member 514 between the drive circuit board 513 and the piezoelectric member 510. The piezoelectric member 510, the metal plate 509, the adhesive 508, and the diaphragm 506 are arranged in this order. The urging member 514 is fixed to the drive circuit board 513 by, for example, soldering. Setting the gap between the drive circuit board 513 and the piezoelectric member 510 shorter than the free length of the urging member 514 allows the piezoelectric member 510 to be urged toward the diaphragm 506 by the urging member 514. At the same time, the urging member 514 urges the metal plate 509 toward the diaphragm 506 via the piezoelectric member 510.

This causes the adhesive 508 to be urged toward the diaphragm 506, thereby physically preventing the separation of the adhesive interface. This allows preventing separation of the adhesive interface of the adhesive 508 to stabilize the flow rate of the piezoelectric pump 500 for a long period of time even if the diaphragm is thin, so that the volatile component of, for example, the ink, is prone to intrude into the adhesive interface. Since the adhesive between the piezoelectric member 510 and the metal plate 509 is also urged to the metal plate 509 by the urging member 514, separation of the adhesive interface is physically prevented. The metal plate 509 may have a larger area than that of the piezoelectric member 510 so as to facilitate transmitting the driving of the piezoelectric member 510 to the diaphragm 506. This allows transmitting a large force to the diaphragm 506 even if the piezoelectric member 510 is small, increasing the flow rate of the pump.

Figure 5:
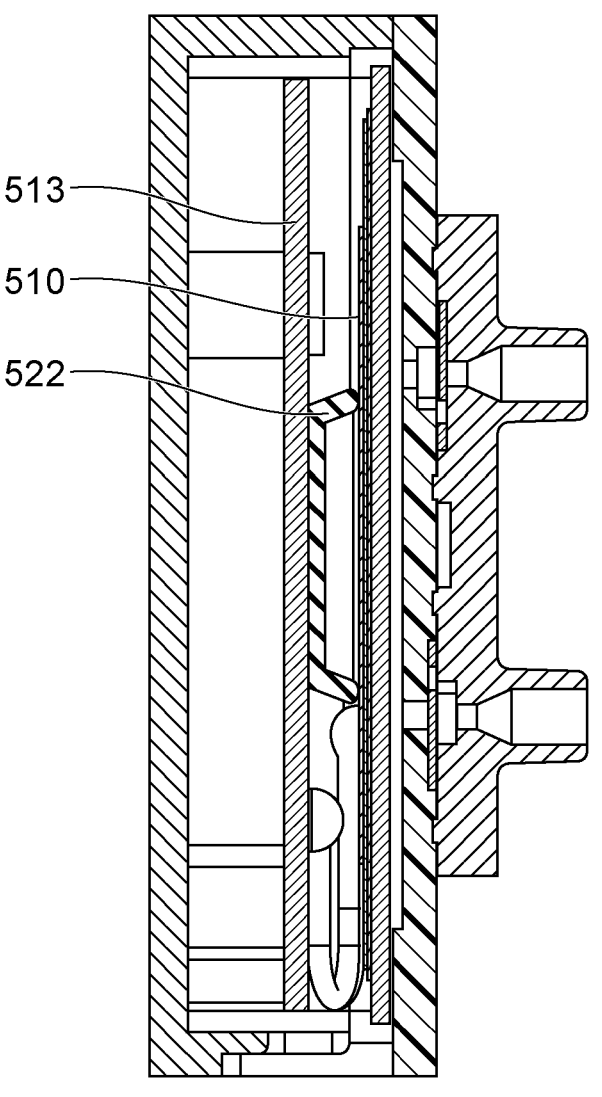
FIG. 5 is a cross-sectional view of the piezoelectric pump in which the urging member is a rubber member.

The urging member 514 may be any member that can urge the piezoelectric member 510, in other words, the metal plate 509, toward the diaphragm 506, for example, an elastic member such as rubber. FIG. 5 is a cross-sectional view of the piezoelectric pump 500 in which a rubber member 522, which is an elastic member, is installed as the urging member 514. The rubber member 522 fixed to the drive circuit board 513 is in contact with the piezoelectric member 510. The elastic force of the rubber member 522 urges the metal plate 509 toward the diaphragm 506 via the piezoelectric member 510.

The elastic member may be a spring member capable of strong urging. Examples of the spring member include, but are not limited to, a conical spring, a torsional spring, and a leaf spring made of sheet metal. The material for the spring member may be stainless steel in consideration of wet performance and elastic characteristics. Alternatively, the spring member may be made of another metal material or resin material. Another alternative is a plated or coated spring member. A plurality of urging members 514 may be provided so as to urge the metal plate 509 toward the diaphragm 506 more strongly.

The drive circuit board 513 has two through holes 515 which fit on fixing pins 516 on the cover 507, as shown in FIG. 3B. By crushing the tips of the fixing pins 516 with heat, the drive circuit board 513 and the cover 507 are fixed to each other. The surface of the drive circuit board 513 adjacent to the cover 507 comes into contact with contact portions 517 of the cover 507. The cover 507 fixed to the drive circuit board 513 is fixed to the supporting member 505 by laser welding. The urging member 514 is in contact with the piezoelectric member 510 or the metal plate 509 and generates a reaction force when compressed, and the reaction force pushes the drive circuit board 513 against contact portions 517 of the cover 507.

Figure 6A:
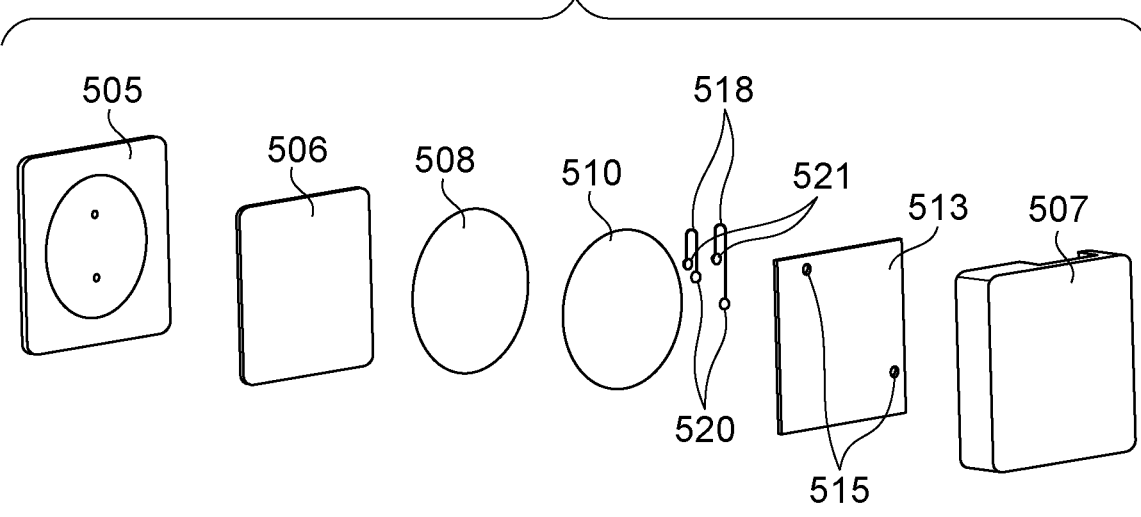
FIG. 6A is an exploded perspective view of the piezoelectric pump seen from the back in which the diaphragm and the piezoelectric member are bonded.
Figure 6B:
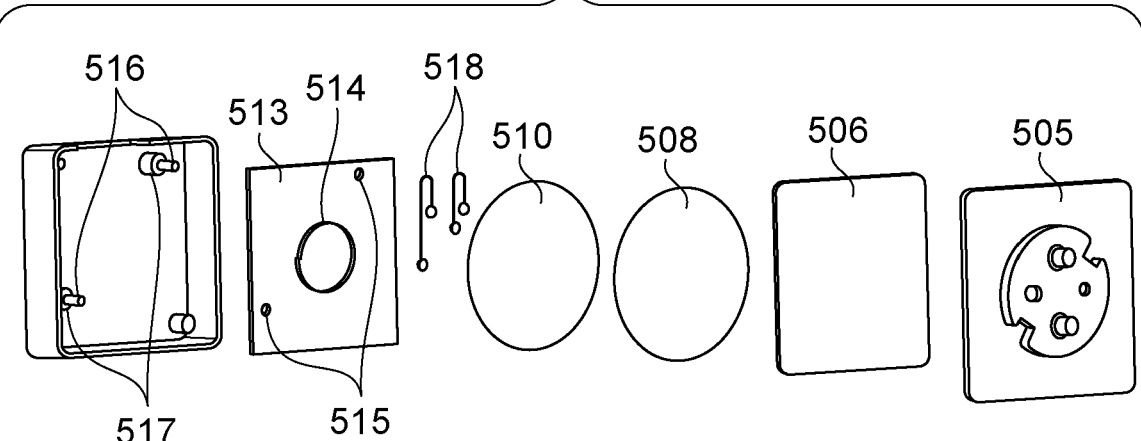
FIG. 6B is an exploded perspective view of the piezoelectric pump seen from the front in which the diaphragm and the piezoelectric member are bonded.

The above embodiment includes the metal plate 509 between the piezoelectric member 510 and the diaphragm 506. However, the metal plate 509 may be omitted as shown in FIGS. 6A and 6B. In this case, the piezoelectric member 510 and the diaphragm 506 are directly bonded together with the adhesive 508. The urging member 514 urges the piezoelectric member 510 toward the diaphragm 506. This allows prevention of the separation of the adhesive interface of the adhesive 508 that bonds the piezoelectric member 510 and the diaphragm 506 together. To drive the piezoelectric member 510, the both sides of the drive circuit board 513 and the piezoelectric member 510 need to be electrically connected with the electrical connection cable 518.

With the above configuration, the piezoelectric member 510 is urged to the diaphragm 506 by the urging member 514 to prevent separation of the adhesive interface of the adhesive 508, thereby allowing stabilization of the flow rate of the piezoelectric pump 500 for a long period of time.

Second Embodiment

The configuration of a piezoelectric pump according to a second embodiment of the present disclosure will be described. In the following description, difference from the first embodiment will be mainly described, and descriptions of the same components as those of the first embodiment will be omitted.

Piezoelectric Pump

Figure 7:
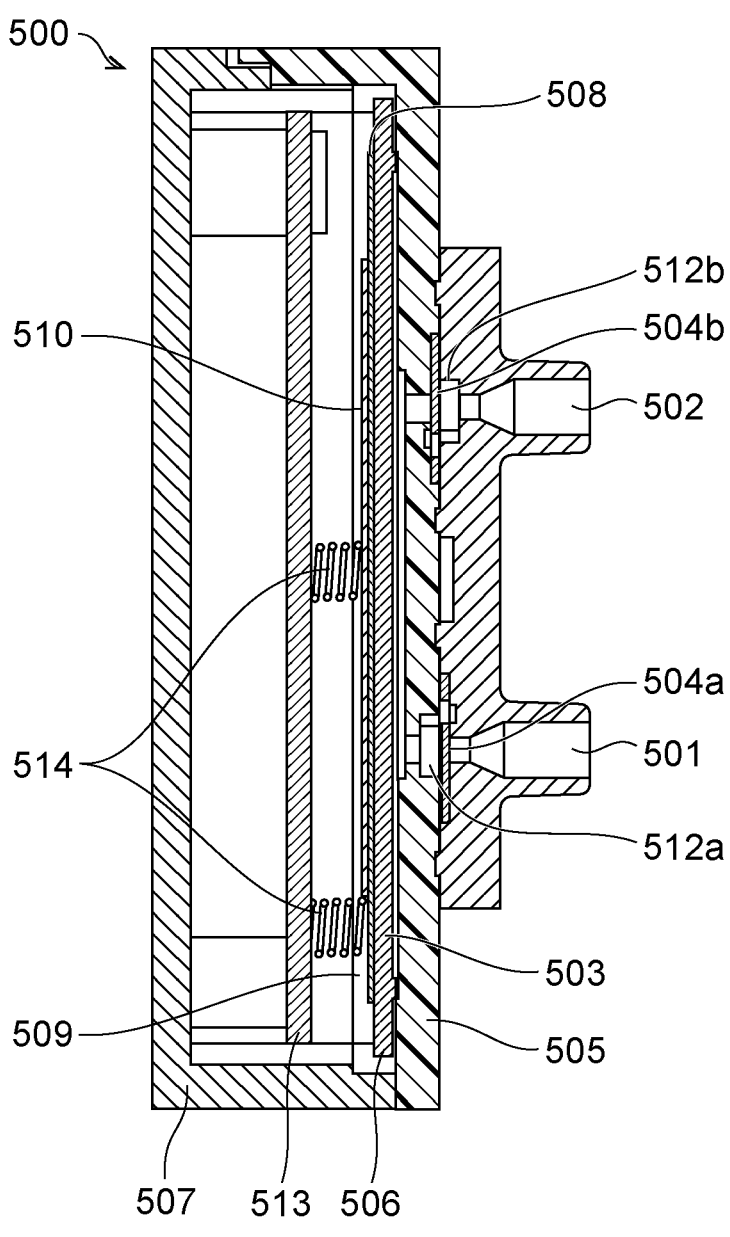
FIG. 7 is a cross-sectional view of a piezoelectric pump of a second embodiment.

FIG. 7 is a cross-sectional view of a piezoelectric pump 500 according to a second embodiment taken along line VII-VII in FIG. 1A. In the second embodiment, a plurality of urging members 514 is provided on the drive circuit board 513. The urging members 514 are made of an electrically conductive material to electrically connect to the drive circuit board 513. Electrical connection using the urging members 514 in this manner requires at least two urging members 514 made of an electrically conductive material. The urging members 514 are fixed to the drive circuit board 513 by, for example, soldering. The electrical connection may be established, not with this configuration, but by using one urging member 514 made of an electrically conductive material and one electrical connection cable 518 shown in the first embodiment.

Figure 8:
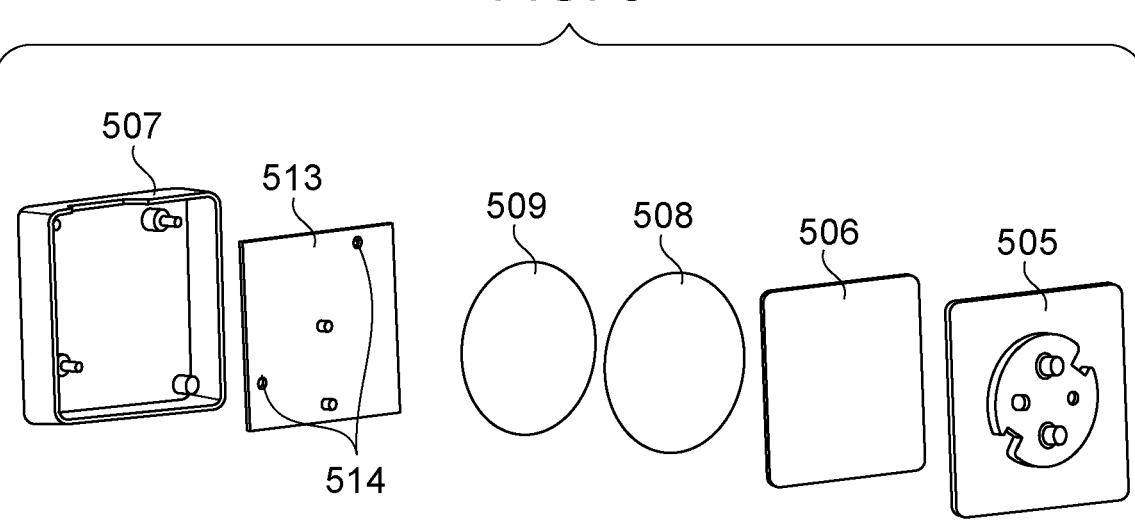
FIG. 8 is an exploded perspective view of the drive unit of the piezoelectric pump.
Figure 9:
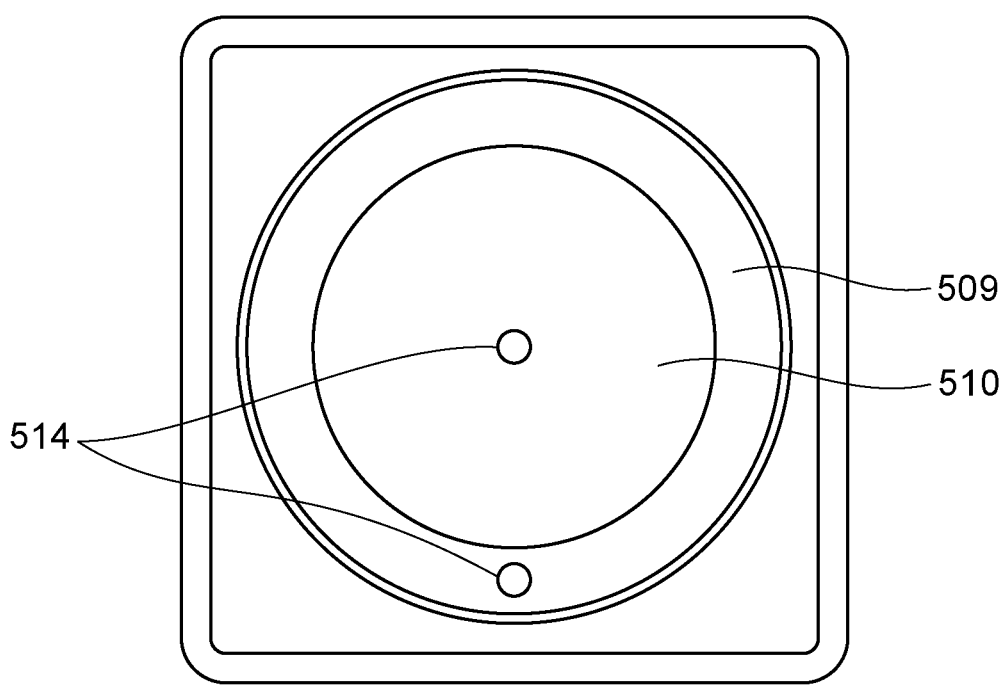
FIG. 9 is a perspective view of the drive unit of the piezoelectric pump.

FIG. 8 is an exploded perspective view of the piezoelectric pump 500. FIG. 9 is a diagram of the electrical connection of the piezoelectric member 510 seen from the drive circuit board 513 through the drive circuit board 513. The two urging members 514 are disposed at positions at which the urging members 514 can be in contact with the piezoelectric member 510 and the metal plate 509, respectively. The gap between the drive circuit board 513 and the piezoelectric member 510 and the gap between the drive circuit board 513 and the metal plate 509 need to be shorter than the free length of the urging members 514. This causes one of the urging members 514 made of an electrically conductive material (referred to as a first urging member) to urge the piezoelectric member 510 toward the metal plate 509 and causes the other of the urging members 514 made of an electrically conductive material (referred to as a second urging member) to urge the metal plate 509 toward the diaphragm 506.

Since the urging member 514 is made of an electrically conductive material, the drive circuit board 513, and the piezoelectric member 510 and the metal plate 509 are connected also electrically. This allows the electrical connection between the drive circuit board 513 and the piezoelectric member 510 and the metal plate 509 to be easily established without soldering cables.

The piezoelectric member 510 receives a voltage applied from the drive circuit board 513 via the urging member 514 and extends and contracts in response to the applied voltage. The metal plate 509 and the diaphragm 506 fixed to the piezoelectric member 510 move in conjunction with the extension and contraction of the piezoelectric member 510 to change the inner pressure of the pump chamber 503. At that time, the metal plate 509 also receives a voltage applied from the drive circuit board 513 via the urging member 514. One of the piezoelectric member 510 and the metal plate 509 may be subjected to a voltage, and the other may be grounded, or may be subjected to voltages with different phases.

Figure 10:
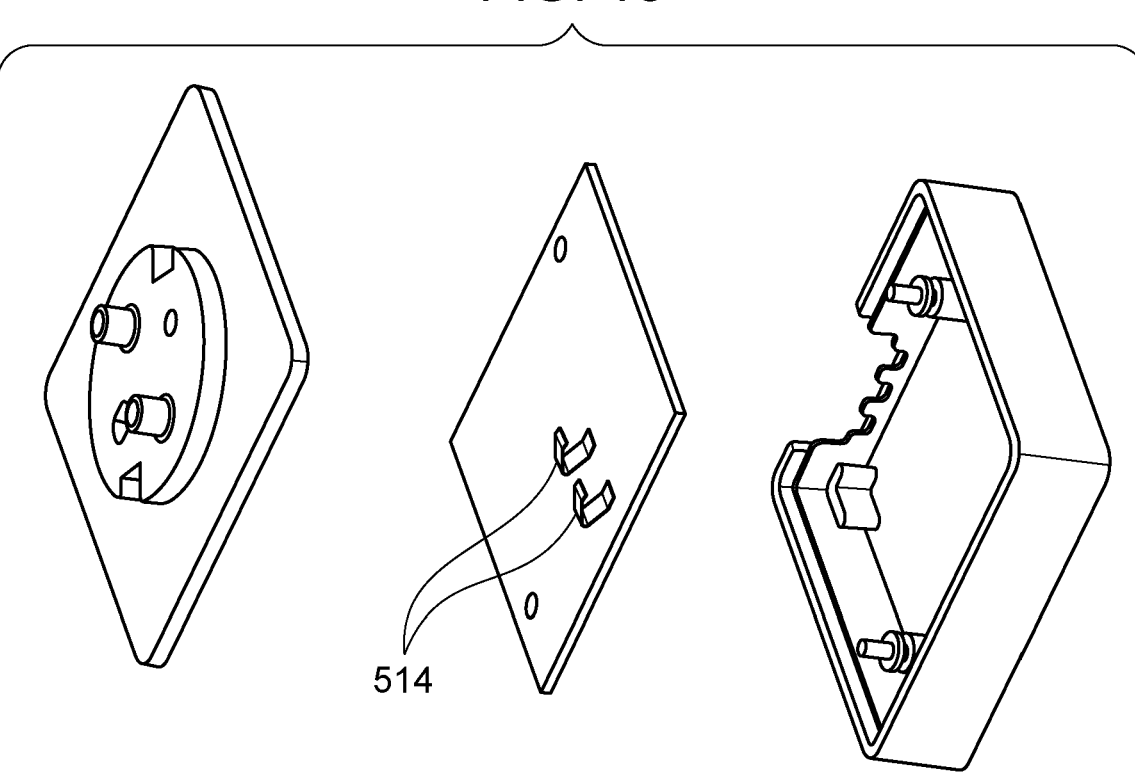
FIG. 10 is an exploded perspective view of the piezoelectric pump in which the urging member is a leaf spring.
Figure 11:
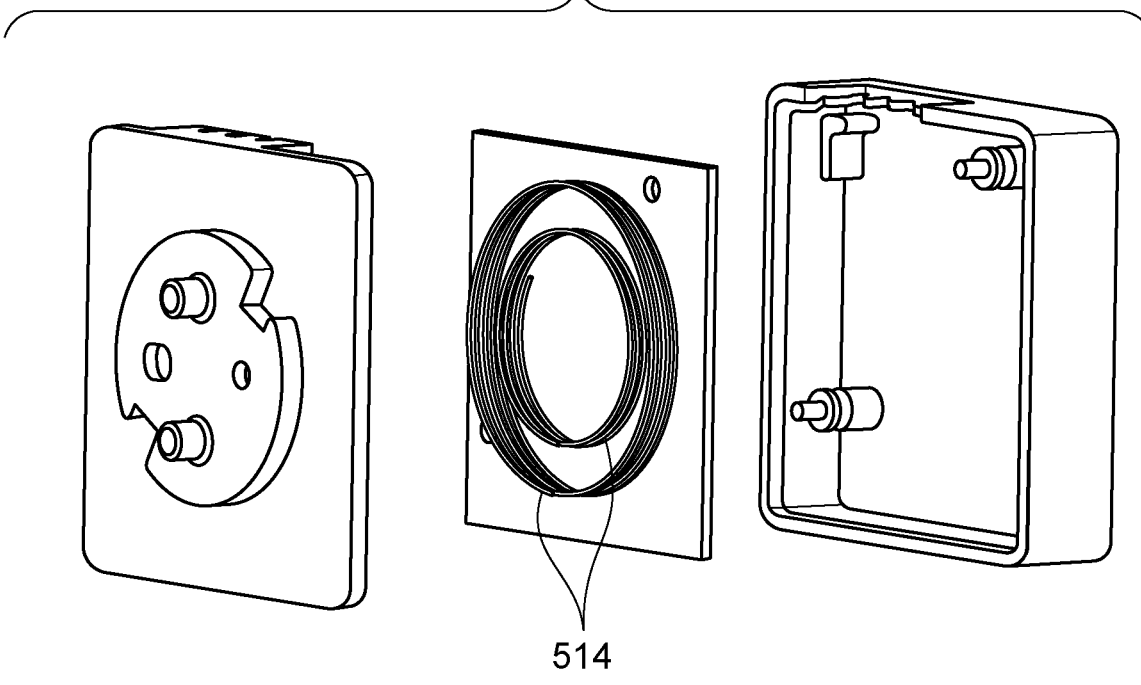
FIG. 11 is an exploded perspective view of the piezoelectric pump in which the urging member is a large-diameter spring.
Figure 12:
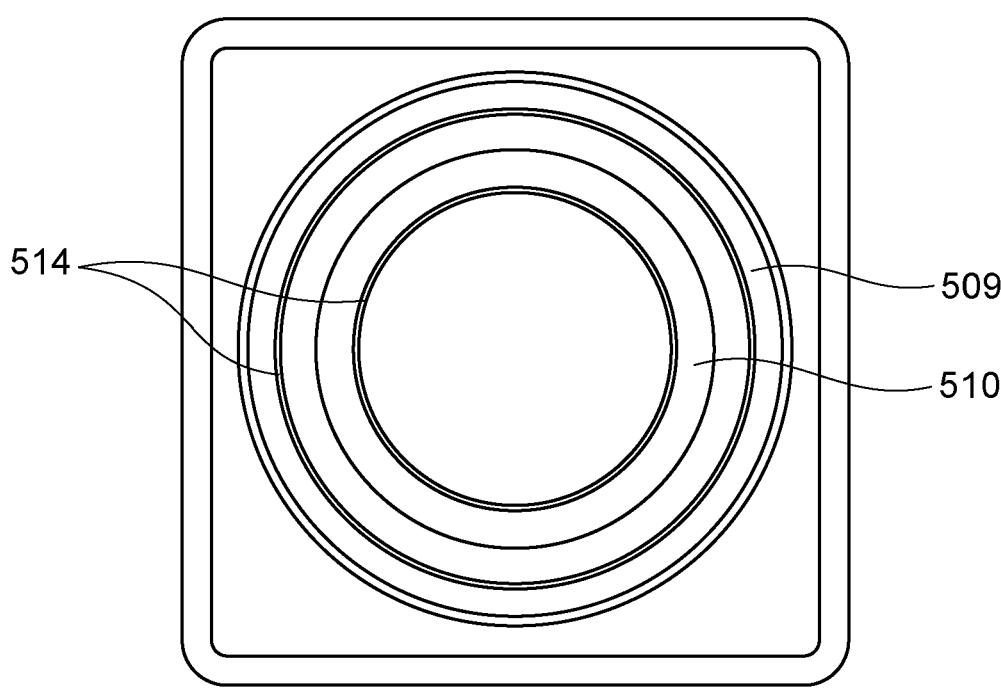
FIG. 12 is a perspective view of the dive unit of the piezoelectric pump in which the urging member is a large-diameter spring.

The urging members 514 may be leaf springs made of sheet metal as shown in FIG. 10, as in the first embodiment. The urging members 514 may be large-diameter springs, as shown in FIG. 11. Specifically, the diameter of the first urging member may be smaller than the diameter of the piezoelectric member 510, and the diameter of the second urging member may be larger than the diameter of the piezoelectric member 510 and smaller than the diameter of the metal plate 509 (see FIG. 12). This allows urging of a wider range with the large-diameter springs while electrically connecting the drive circuit board 513 to the piezoelectric member 510 and the metal plate 509, allowing further preventing separation of the adhesive interface of the adhesive 508.

With the above configuration, the piezoelectric member 510 and the metal plate 509 are electrically connected and urged toward the diaphragm 506 by the urging member 514. This allows preventing separation of the adhesive interface of the adhesive, thereby providing a piezoelectric pump that is reliable for a long period of time at low cost.

Liquid Discharge Apparatus

A liquid discharge apparatus equipped with a liquid discharge head 1 including the piezoelectric pump 500 of the above embodiments will be described. This embodiment will be described using an example employing a thermal method for discharging liquid by generating air bubbles with an electrothermal converting element as a liquid discharge element, but this is given for mere illustrative purposes. The present disclosure may be applied to a liquid discharge head that employs a discharge method for discharging liquid using a piezoelectric element or another discharge method. The configurations of the pump, the pressure adjusting means, and so on described below are also not limited to the configurations described in the embodiments and the drawings.

Figure 13A:
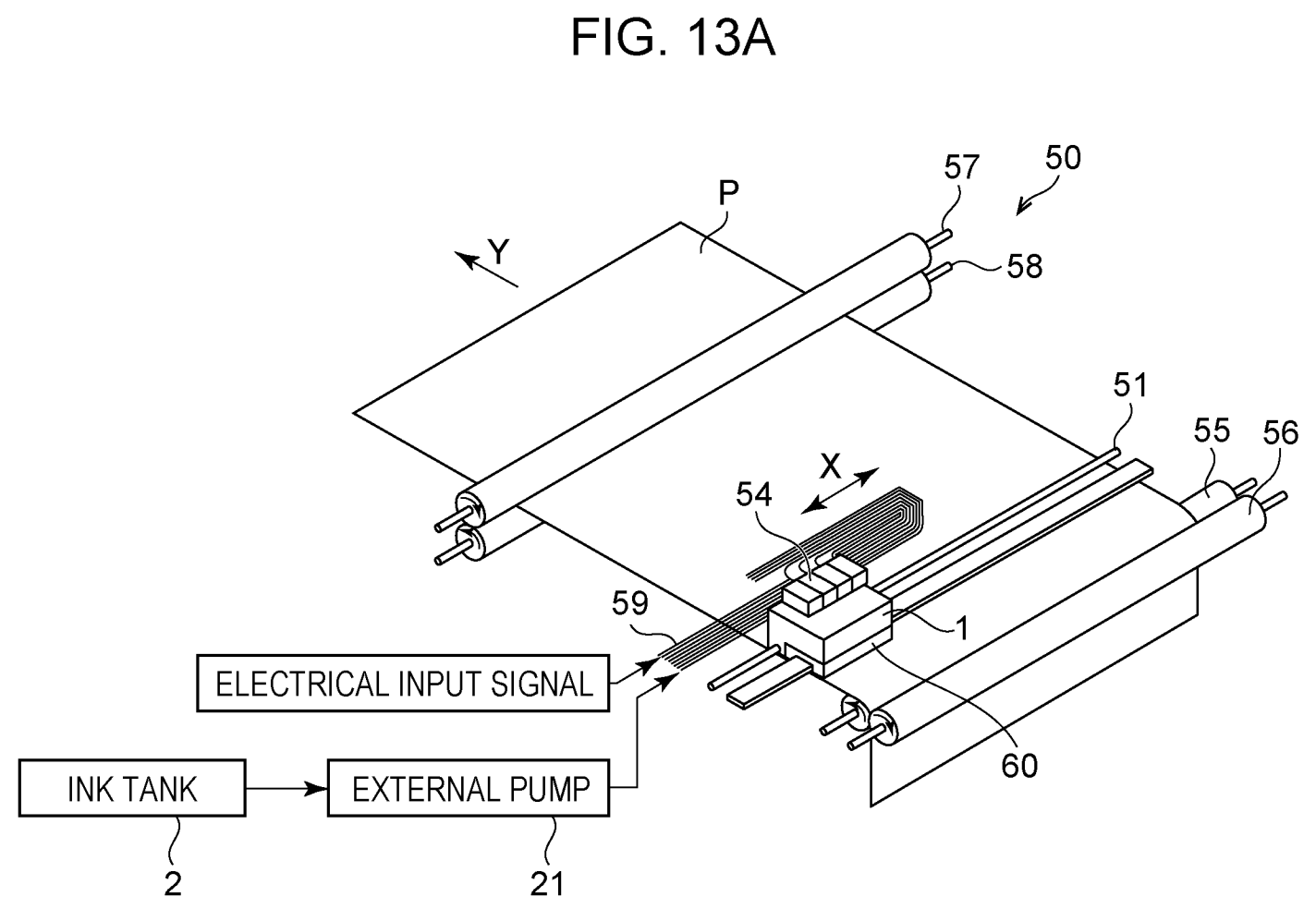
Figure 13B:
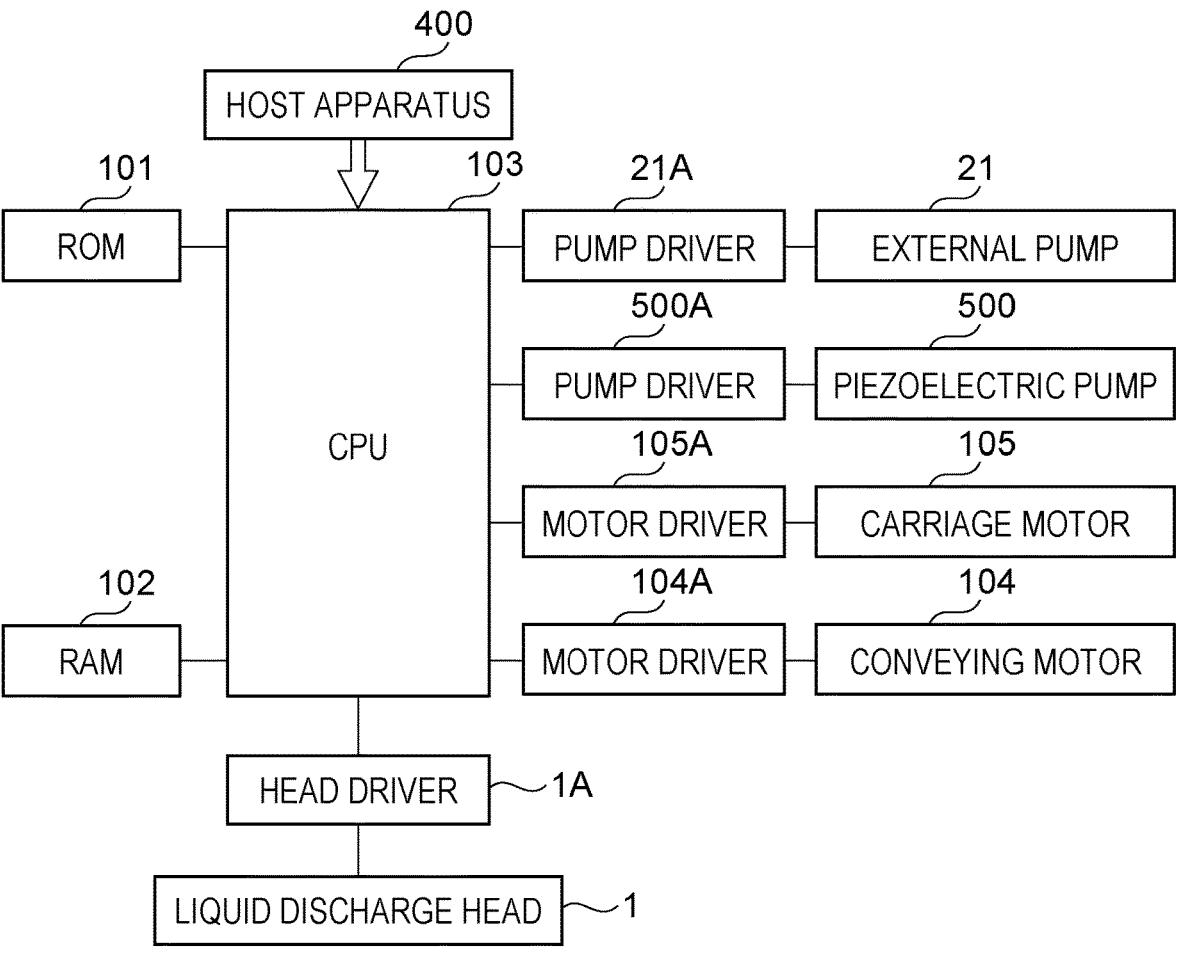
FIG. 13B is a block diagram illustrating the control system of the liquid discharge apparatus.

FIGS. 13A and 13B are diagrams for illustrating the liquid discharge apparatus, illustrating the liquid discharge head and the peripherals of the liquid discharge apparatus. First, the schematic configuration of the liquid discharge apparatus 50 of this embodiment will be described with reference to FIGS. 13A and 13B. FIG. 13A is a perspective view of the liquid discharge apparatus including the liquid discharge head 1. A liquid discharge apparatus 50 of this embodiment is a serial ink-jet recording apparatus that discharges ink, or liquid, while moving the liquid discharge head 1 to record on a recording medium P. Another example is a what-is-called full-line liquid discharge head including discharge ports across the width of the recording medium P and capable of discharge across the width of the recording medium P without moving in a main scanning direction, described below.

The liquid discharge head 1 is mounted on a mount (a carriage 60). The carriage 60 moves back and forth in the main scanning direction (X-direction) along a guide shaft 51. The recording medium P is conveyed in a sub-scanning direction (Y-direction) intersecting (in this example, at right angles) the main scanning direction by conveying rollers 55, 56, 57, and 58. In the following drawings, the Z-direction is the vertical direction and intersecting (in this embodiment, at right angles) an X-Y plane defined by the X-direction and the Y-direction. The liquid discharge head 1 is detachably attached to the carriage 60 by the user.

The liquid discharge head 1 includes a circulation unit 54 and a discharge unit 3 (see FIG. 14), described below. The discharge unit 3 includes a plurality of discharge ports for discharging liquid and discharge elements that generate discharge energy for discharging liquid from the individual discharge ports, the specific configuration of which will be described below.

The liquid discharge apparatus 50 includes an ink tank 2, which is an ink supply source, and an external pump 21. The ink stored in the ink tank 2 is supplied to the circulation unit 54 through an ink supply tube 59 by the driving force of the external pump 21.

The liquid discharge apparatus 50 forms a predetermined image on the recording medium P by repeating a recording scanning operation in which the liquid discharge head 1 mounted on the carriage 60 discharges ink while moving in the main scanning direction and a conveying operation of conveying the recording medium P in the sub-scanning direction. The liquid discharge head 1 of this embodiment is capable of discharging four kinds of ink, black (K), cyan (C), magenta (M), and yellow (Y), and can record a full-color image with the inks. The ink that the liquid discharge head 1 can discharge is not limited to the above four kinds of ink. The present disclosure is also applicable to liquid discharge heads for discharging other kinds of ink. In other words, the kind and number of ink discharged from the liquid discharge head are not limited.

The liquid discharge apparatus 50 includes a cap (not shown), at a position out of the conveying path of the recording medium P in the X-direction, capable of covering a discharge port surface in which the discharge ports of the liquid discharge head 1 are formed. The cap covers the discharge port surface of the liquid discharge head 1 in non-print operation to prevent the discharge ports from drying, protect the discharge ports, and suck the ink from the discharge ports.

The liquid discharge head 1 shown in FIG. 13A includes four circulation units 54 for four kinds of ink. Alternatively, the liquid discharge head 1 may include circulation units 54 according to the kinds of discharge liquid. A plurality of circulation units 54 may be provided for the same kind of liquid. In other words, the liquid discharge head 1 may include one or more circulation units. Not all of four kinds of ink, but only one kind of ink may be circulated.

FIG. 13B is a block diagram illustrating the control system of the liquid discharge apparatus 50. A central processing unit (CPU) 103 functions as a controller for controlling the operation of the components of the liquid discharge apparatus 50 on the basis of programs, such as a processing procedure, stored in a read-only memory (ROM) 101. A random-access memory (RAM) 102 is used as a work area used when the CPU 103 executes processes. The CPU 103 receives image data from a host apparatus 400 outside the liquid discharge apparatus 50 and controls a head driver 1A to control the driving of the discharge elements provided in the discharge unit 3. The CPU 103 also controls drivers of various actuators provided in the liquid discharge apparatus 50. For example, the CPU 103 controls a motor driver 105A for a carriage motor 105 for moving the carriage 60 and a motor driver 104A for a conveying motor 104 for conveying the recording medium P. The CPU 103 also controls a pump driver 500A for driving the piezoelectric pump 500, described below, and a pump driver 21A for the external pump 21. FIG. 13B shows a configuration for a process of receiving image data from the host apparatus 400. Alternatively, the liquid discharge apparatus 50 may execute a process not based on data from the host apparatus 400.

Basic Configuration of Liquid Discharge Head

Figure 14:
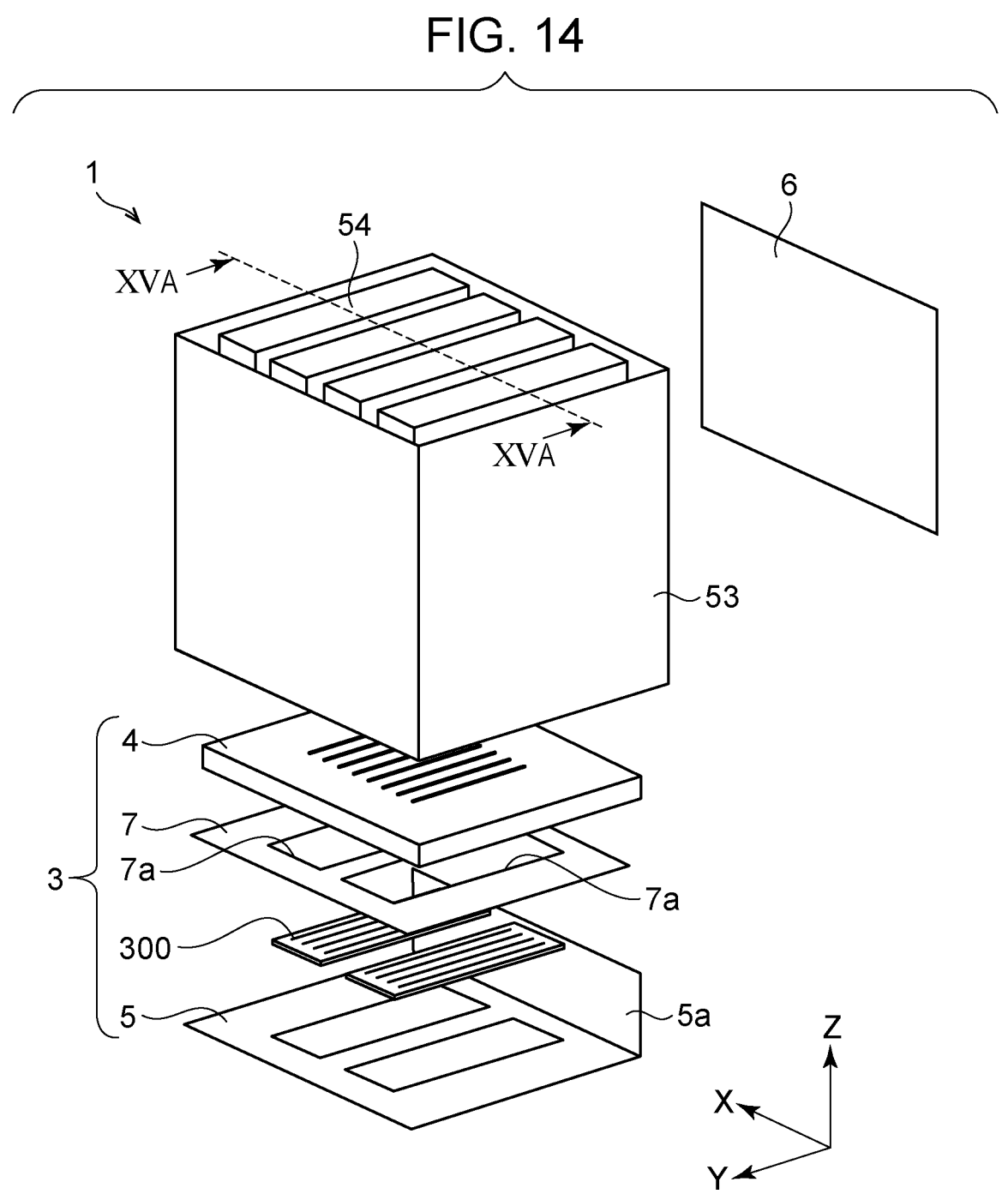
Figure 15A:
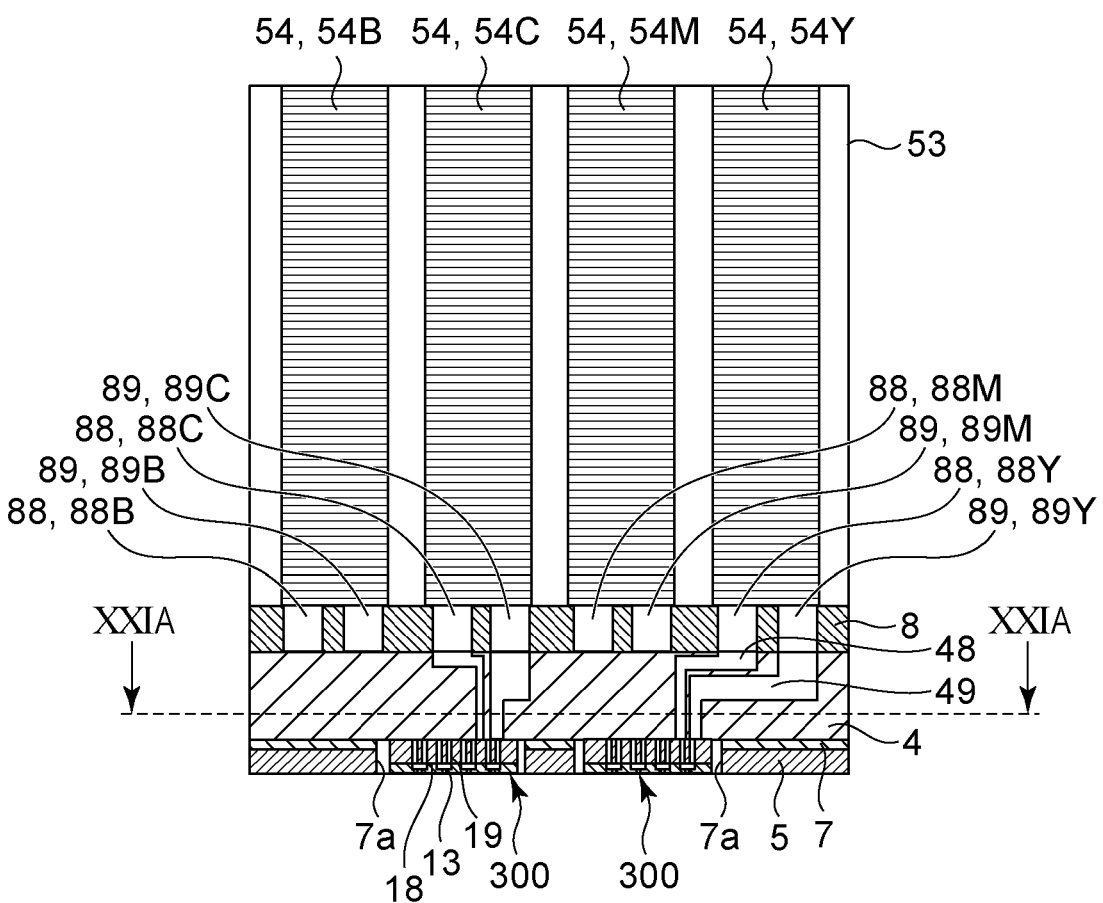
FIG. 15A is a longitudinal cross-sectional view of the liquid discharge head.
Figure 15B:
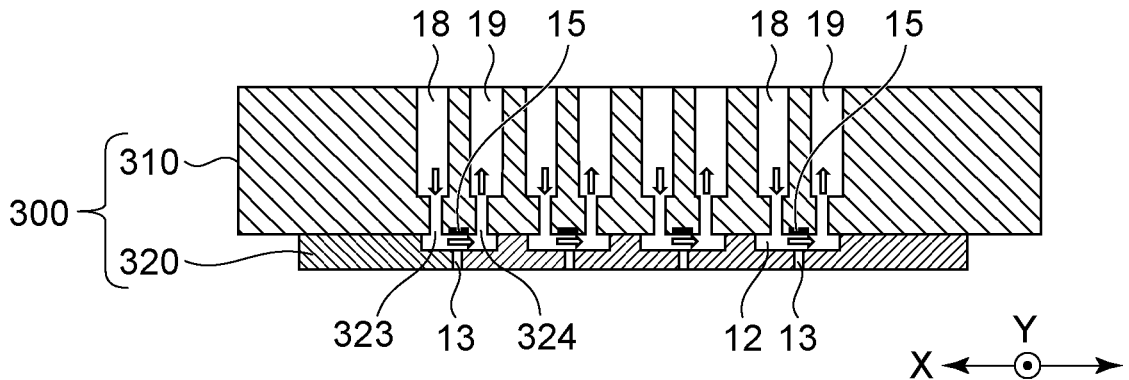
FIG. 15B is an enlarged cross-sectional view of a discharge module.

FIG. 14 is an exploded perspective view of the liquid discharge head 1 of this embodiment. FIGS. 15A and 15B are cross-sectional views of the liquid discharge head 1 in FIG. 14 taken along line XVA-XVA. FIG. 15A is an overall longitudinal cross-sectional view of the liquid discharge head 1. FIG. 15B is an enlarged view of the discharge module 300 shown in FIG. 15A. The basic configuration of the liquid discharge head 1 of this embodiment will be described hereinbelow mainly with reference to FIG. 14 and FIGS. 15A and 15B, as well as FIG. 13A as appropriate.

As shown in FIG. 14, the liquid discharge head 1 includes the circulation unit 54 and the discharge unit 3 for discharging the ink supplied from the circulation unit 54 onto the recording medium P. The liquid discharge head 1 of this embodiment is fixed and supported by the carriage 60 with a positioning means and electrical contact (not shown) provided at the carriage 60 of the liquid discharge apparatus 50. The liquid discharge head 1 records on the recording medium P by discharging ink while moving in the main scanning direction (X-direction), shown in FIG. 13A, together with the carriage 60.

The external pump 21 connected to the ink tank 2 serving as an ink supply source is provided with the ink supply tube 59 (see FIG. 13A). The ink supply tube 59 has a liquid connector (not shown) at the distal end. When the liquid discharge head 1 is installed in the liquid discharge apparatus 50, the liquid connector provided at the distal end of the ink supply tube 59 is airtightly connected to a liquid-connector insertion slot (not shown) in the head casing 53 of the liquid discharge head 1. Thus, an ink supply channel extending from the ink tank 2 through the external pump 21 to the liquid discharge head 1 is formed. Since this embodiment uses four kinds of ink, four sets of the ink tank 2, the external pump 21, the ink supply tube 59, and the circulation unit 54 are provided for the individual inks, and four ink supply channels for the individual inks are independently provided.

Thus, the liquid discharge apparatus 50 of this embodiment is equipped with an ink supply system in which ink is supplied from the ink tank 2 provided outside the liquid discharge head 1. The liquid discharge apparatus 50 of this embodiment does not include an ink collecting system for collecting the ink in the liquid discharge head 1 into the ink tank 2. Accordingly, the liquid discharge head 1 includes the liquid-connector insertion slot (not shown) for connecting the ink supply tube 59 of the ink tank 2 but does not include a connector insertion slot for connecting a tube for collecting the ink in the liquid discharge head 1 into the ink tank 2. The liquid-connector insertion slot 53a is provided for each ink.

In FIG. 15A, reference sign 54B denotes a black-ink circulation unit, 54C denotes a cyan-ink circulation unit, 54M denotes a magenta-ink circulation unit, and 54Y denotes a yellow-ink circulation unit. The circulation units 54B, 54C, 54M, and 54Y have substantially the same configuration. The circulation units 54B, 54C, 54M, and 54Y are all referred to as "circulation unit 54" in this embodiment when no particular distinction is made.

In FIGS. 14 and 15A, the discharge unit 3 includes two discharge modules 300, a first supporting member 4, a second supporting member 7, an electrical wiring member 5 (electrical wiring tape) 5, and an electrical contact substrate 6. As shown in FIG. 15B, each discharge module 300 includes a silicon substrate 310 with a thickness of 0.5 to 1 mm and a plurality of discharge elements 15 provided on one surface of the silicon substrate 310. The discharge elements 15 of this embodiment are electrothermal conversion elements (heaters) that generate thermal energy as discharge energy for discharging liquid. Electrothermal conversion elements convert applied electrical energy to thermal energy and transmits the thermal energy to the liquid to discharge the liquid. Each discharge element 15 is supplied with electrical power through an electrical wiring line formed on the silicon substrate 310 using a deposition technique.

A discharge-port formed member 320 is provided on a surface (the lower surface in FIG. 15B) of the silicon substrate 310. The discharge-port formed member 320 has a plurality of pressure chambers 12 corresponding to the plurality of discharge elements 15 and a plurality of discharge ports 13 formed using a photolithography technique. The pressure chambers 12 are spaces where energy generated by the individual discharge elements 15 acts. In other words, a pressure chamber is a space in which the discharge element is disposed. The silicon substrate 310 further includes common supply channels 18 and common collecting channels 19. The silicon substrate 310 further includes supply connecting channels 323 each communicating between the common supply channel 18 and the pressure chamber 12 and collection connecting channels 324 each communicating between the common collecting channel 19 and the pressure chamber 12. In this embodiment, one discharge module 300 discharges two kinds of ink. In other words, of the two discharge modules 300 shown in FIG. 15A, the discharge module 300 at the left in the drawing discharges black ink and cyan ink, and the discharge module 300 at the right in the drawing discharges magenta ink and yellow ink. This combination is illustrative only, and any other combination of ink is possible. One discharge module may discharge one kind of ink or three kinds or more of ink. Two discharge modules 300 do not have to discharge the same number of kinds of ink. The discharge unit 3 may include one discharge module 300 or three or more discharge modules 300. In the example shown in FIGS. 15A and 15B, two discharge port arrays extending in the Y-direction are provided for one color ink. The pressure chamber 12, the common supply channels 18, and the common collecting channels 19 are provided for each of the plurality of discharge ports 13 constituting each discharge port array.

The silicon substrate 310 includes an ink supply port and an ink collecting port, described below, on the back (the upper surface in FIG. 15B). The ink supply port is used to supply ink to the plurality of common supply channels 18 from an ink supply channel 48. The ink collecting port is used collect the ink to an ink collecting channel 49 from the plurality of common collecting channels 19.

The ink supply port and the ink collecting port in this case refer to openings for use in supplying and collecting ink in forward ink circulation. In other words, the forward ink circulation supplies the ink from the ink supply port to the common supply channels 18 and collects the ink from the common collecting channels 19 to the ink collecting port. Backward ink circulation can also be performed. In this case, the ink is supplied from the ink collecting port, described above, to the common collecting channels 19 and is collected from the common supply channels 18 to the ink supply port.

As shown in FIG. 15A, the back (the upper surface in FIG. 15A) of the discharge module 300 is bonded and fixed to one surface (the lower surface in FIG. 15A) of the supporting member 4. The first supporting member 4 includes the ink supply channel 48 and the ink collecting channel 49 passing therethrough from one surface to the other surface. One opening of the ink supply channel 48 communicates with the above-described ink supply port of the silicon substrate 310, and the other opening of the ink collecting channel 49 communicates with the above-described ink collecting port of the silicon substrate 310. The ink supply channel 48 and the ink collecting channel 49 are provided independently for each kind of ink.

The second supporting member 7 having an opening 7a (see FIG. 14) through which the discharge module 300 is passed is bonded and fixed to one surface (the lower surface in FIG. 15A) of the first supporting member 4. The second supporting member 7 holds an electrical wiring member 5 electrically connected to the discharge module 300. The electrical wiring member 5 is a member for applying an electrical signal for discharging ink to the discharge module 300. The electrical connection between the discharge module 300 and the electrical wiring member 5 is sealed with a sealing material (not shown), thereby being protected against ink corrosion and external impact.

An electrical contact substrate 6 is thermally compressed to an end 5*a* of the electrical wiring member 5 (see FIG. 14) using anisotropically-conductive film (not shown), so that the electrical wiring member 5 and the electrical contact substrate 6 are electrically connected. The electrical contact substrate 6 includes an external-signal input terminal (not shown) for receiving an electrical signal from the liquid discharge apparatus 50.

A joint member 8 (FIG. 15A) is provided between the first supporting member 4 and the circulation unit 54. The joint member 8 includes a supply port 88 and a collection port 89 for each kind of ink. The supply port 88 and the collection port 89 communicate between the ink supply channel 48 and the ink collecting channel 49 of the first supporting member 4 and the channels in the circulation unit 54. In FIG. 15A, the supply port 88B and the collection port 89B are provided for black ink, and the supply port 88C and the collection port 89C are provided for cyan ink. The supply port 88M and the collection port 89M are provided for magenta ink, and the supply port 88Y and the collection port 89Y are for yellow ink.

The opening at one end of each of the ink supply channel 48 and the ink collecting channels 49 of the first supporting member 4 has a small opening area fitted to the ink supply port and the ink collecting port of the silicon substrate 310, respectively. In contrast, the opening at the other end of each of the ink supply channel 48 and the ink collecting channels 49 of the first supporting member 4 has a shape with the same area as the large opening area of the joint member 8 formed so as to be fitted to the channel in the circulation unit 54. This configuration prevents an increase in channel resistance to the ink collected through the collecting channels. However, the shapes of the openings at one end and the other end of the ink supply channel 48 and the ink collecting channels 49 are not limited to the above examples.

In the liquid discharge head 1 with the above configuration, the ink supplied to the circulation unit 54 passes through the supply port 88 of the joint member 8 and the ink supply channel 48 of the first supporting member 4 and flows into the common supply channel 18 via the ink supply port of the discharge module 300. The ink subsequently flows from the common supply channel 18 into the pressure chamber 12 through the supply connecting channel 323, and part of the ink flowing into the pressure chamber 12 is discharged from the discharge port 13 by the driving of the discharge element 15. Remaining ink that has not discharged passes through the pressure chamber 12, the collection connecting channel 324, and the common collecting channel 19 and flows into the ink collecting channel 49 of the first supporting member 4 via the ink collecting port. The ink flowing into the ink collecting channel 49 flows into the circulation unit 54 for collection through the collection port 89 of the joint member 8.

Components of Circulation Unit

Figure 16:
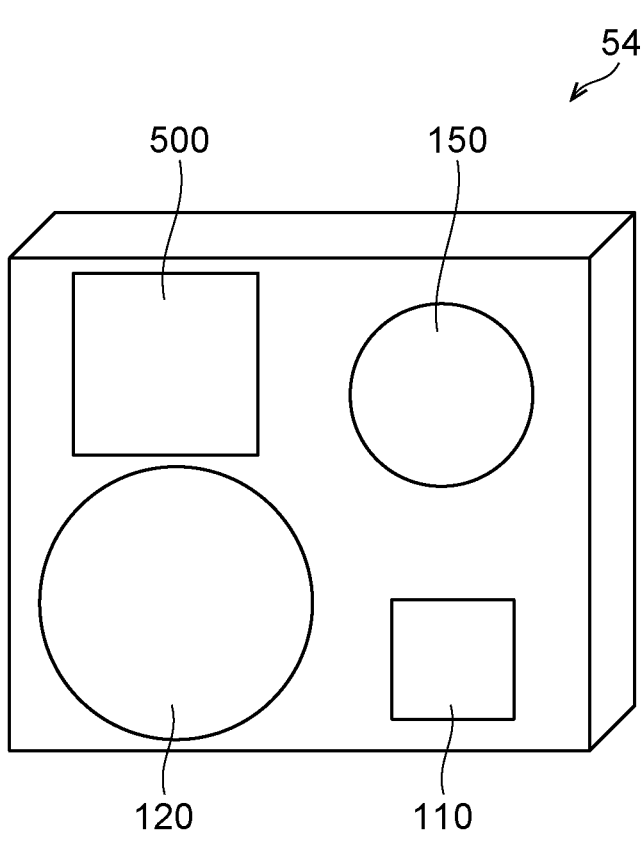
FIG. 16 is a schematic external view of a circulation unit.
Figure 18:
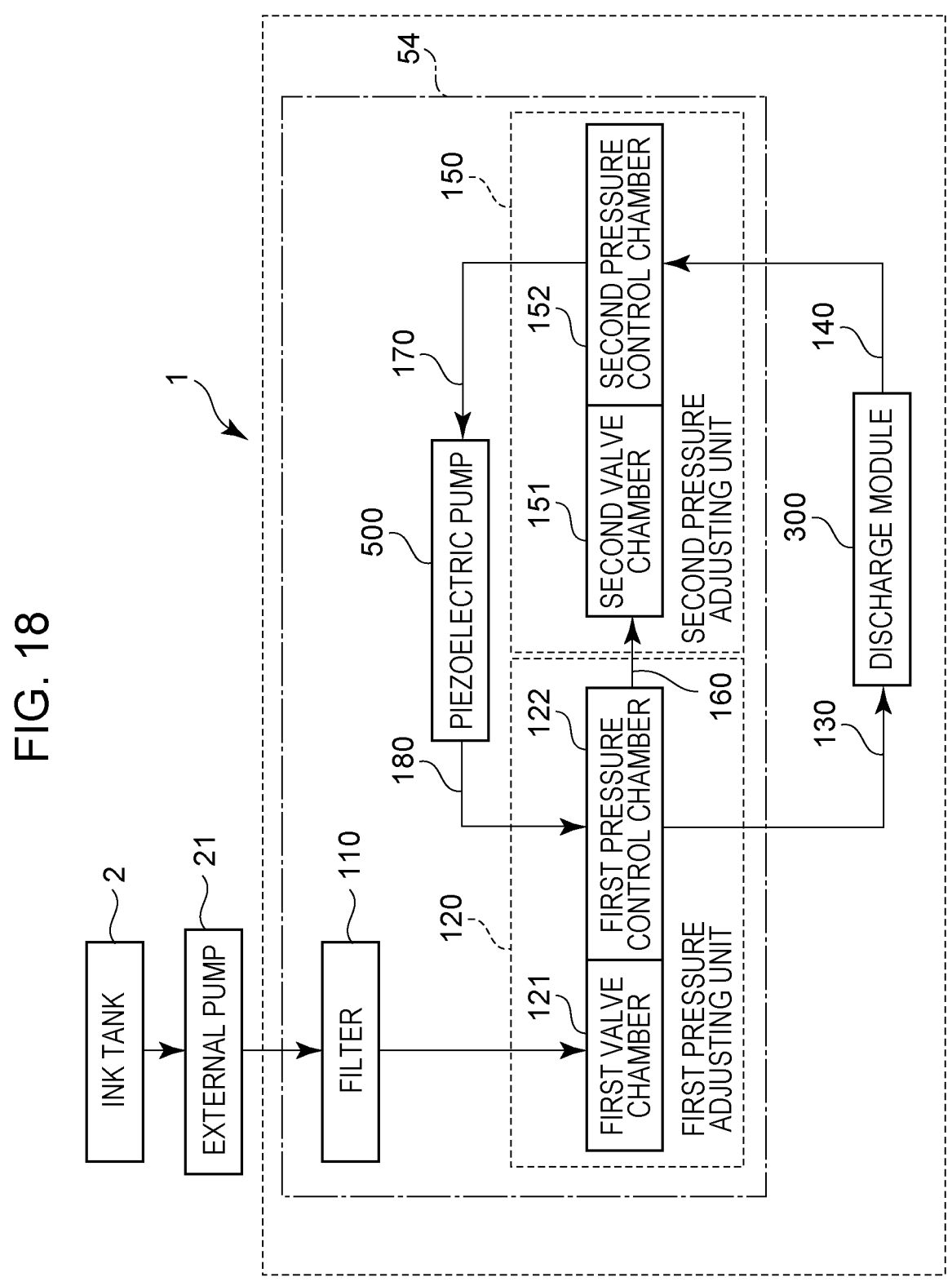
FIG. 18 is a schematic block diagram of the circulation path.

FIG. 16 is a schematic external view of one circulation unit 54 for one kind of ink applied to the recording apparatus of this embodiment. The circulation unit 54 includes a filter 110, a first pressure adjusting unit 120, a second pressure adjusting unit 150, and the piezoelectric pump 500. These components are connected with channels as shown in FIGS. 17 and 18 to constitute a circulation path for supplying and collecting ink to and from the discharge module 300 in the liquid discharge head 1. The urging member 514 of the piezoelectric pump 500 may be disposed so as to urge the piezoelectric member 510 in the direction parallel to the moving direction of the carriage 60 in the viewpoint of securing a space in the circulation unit 54.

Circulation Path in Liquid Discharge Head

FIG. 17 is a schematic longitudinal cross-sectional view of the circulation path of one kind of ink (one-color ink) configured in the liquid discharge head 1. FIG. 18 is a schematic block diagram of the circulation path shown in FIG. 17. As shown in FIGS. 17 and 18, the first pressure adjusting unit 120 includes a first valve chamber 121 and a first pressure control chamber 122. The second pressure adjusting unit 150 includes a second valve chamber 151 and a second pressure control chamber 152. The first pressure adjusting unit 120 is configured to have higher control pressure than that of the second pressure adjusting unit 150. This embodiment enables circulation in a fixed pressure range in the circulation path by using the two pressure adjusting units 120 and 150. This embodiment is configured so that ink flows through the pressure chamber 12 (discharge element 15) at a flow rate according to the pressure difference between the first pressure adjusting unit 120 and the second pressure adjusting unit 150. Referring to FIGS. 17 and 18, the circulation path in the liquid discharge head 1 and the flow of ink in the circulation path will be described hereinbelow. The arrows in the drawings indicate directions in which the ink flows.

First, the connection status of the components of the liquid discharge head 1 will be described.

The external pump 21 that pumps the ink contained in the ink tank 2 (FIG. 18) provided outside the liquid discharge head 1 to the liquid discharge head 1 is connected to the circulation unit 54 via the ink supply tube 59 (FIG. 13A). An inflow channel 600 upstream in the circulation unit 54 includes the filter 110 and communicates with the first valve chamber 121 of the first pressure adjusting unit 120. That is, the inflow channel 600 connects to a first channel 201. The first valve chamber 121 communicates with the first pressure control chamber 122 via a communication port 191A which can be opened and closed by a valve 190A shown in FIG. 17.

The first pressure control chamber 122 is connected to a supply channel 130, a bypass channel 160, and a pump outlet channel 180 of the piezoelectric pump 500. The supply channel 130 is connected to the common supply channel 18 via the above-described ink supply port in the discharge module 300. The bypass channel 160 is connected to a second valve chamber 151 provided in the second pressure adjusting unit 150. The second valve chamber 151 communicates with the second pressure control chamber 152 via a communication port 191B which is opened and closed by a valve 190B shown in FIG. 17. FIGS. 17 and 18 show an example in which one end of the bypass channel 160 is connected to the first pressure control chamber 122 of the first pressure adjusting unit 120, and the other end of the bypass channel 160 is connected to the second valve chamber 151 of the second pressure adjusting unit 150. Alternatively, one end of the bypass channel 160 may be connected to the supply channel 130, and the other end of the bypass channel may be connected to the second valve chamber 151.

The second pressure control chamber 152 is connected to the collecting channel 140. The collecting channel 140 is connected to the common collecting channel 19 via the above-described ink collecting port provided in the discharge module 300. The second pressure control chamber 152 is connected to the piezoelectric pump 500 via the pump inlet channel 170. In FIG. 17, reference sign 170*a* denotes the inflow port of the pump inlet channel 170.

Next, the flow of ink in the liquid discharge head 1 with the above configuration will be described. As shown in FIG.

18, the ink contained in the ink tank 2 is pressurized by the external pump 21 provided for the liquid discharge apparatus 50 into a positive-pressure ink flow and is supplied to the circulation unit 54 of the liquid discharge head 1.

The ink supplied to the circulation unit 54 passes through the filter 110 so that foreign materials and air bubbles are removed and flows into the first valve chamber 121 in the first pressure adjusting unit 120. The pressure of the ink is decreased because of a pressure loss when the ink passes through the filter 110 but is positive at this stage. Thereafter, the ink flowing into the first valve chamber 121 passes through the communication port 191A, when the valve 190A is opened, into the first pressure control chamber 122. The ink that flowing into the first pressure control chamber 122 is switched from the positive pressure to a negative pressure because of pressure loss when passing through the communication port 191A.

Next, the flow of the ink in the circulation path will be described. The piezoelectric pump 500 is a pump that makes liquid flow by applying a voltage to the piezoelectric member 510 to vibrate the diaphragm 506, as described in the above embodiment. The piezoelectric pump 500 operates so as to send the ink sucked from the upstream pump inlet channel 170 to the downstream pump outlet channel 180. The driving of the pump causes the ink supplied to the first pressure control chamber 122 to flow into the supply channel 130 and the bypass channel 160 together with the ink sent from the pump outlet channel 180.

The ink flowing into the supply channel 130 passes through the ink supply port of the discharge module 300 and the common supply channel 18 into the pressure chamber 12, and part of the ink is discharged from the discharge port 13 by the driving (heat generation) of the discharge element 15. Remaining ink not used for discharge flows through the pressure chamber 12 and the common collecting channel 19 into the collecting channel 140 connected to the discharge module 300. The ink flowing into the collecting channel 140 flows into the second pressure control chamber 152 of the second pressure adjusting unit 150.

In contrast, the ink flowing from the first pressure control chamber 122 into the bypass channel 160 flows into the second valve chamber 151 and then passes through the communication port 191B into the second pressure control chamber 152. The ink flowing into the second pressure control chamber 152 through the bypass channel 160 and the ink collected from the collecting channel 140 are sucked into the piezoelectric pump 500 through the pump inlet channel 170 by the driving of the piezoelectric pump 500. The ink sucked into the piezoelectric pump 500 is sent to the pump outlet channel 180 and flows into the first pressure control chamber 122 again. From then, the ink flowing into the second pressure control chamber 152 from the first pressure control chamber 122 through the supply channel 130 and the discharge module 300 and the ink flowing into the second pressure control chamber 152 through the bypass channel 160 flow into the piezoelectric pump 500. The ink is sent from the piezoelectric pump 500 to the first pressure control chamber 122. Thus, the ink is circulated in the circulation path.

The channel connected to the pressure chamber 12 to supply liquid to the pressure chambers 12 is referred to as "first channel 201", and the other channel connected to the pressure chamber 12 is referred to as "second channel 202". In other words, the pump outlet channel 180 and the supply channel 130 are collectively referred to as "first channel 201", and the collecting channel 140 and the pump inlet channel 170 are collectively referred to as "second channel 202". As shown in FIG. 17, the first channel 201 may include the first pressure adjusting unit 120 for adjusting the pressure of the liquid in the first channel 201, and the pump outlet channel 180 and the supply channel 130 may be connected together via the first pressure adjusting unit 120. Similarly, the second channel 202 may include the second pressure adjusting unit 150 for adjusting the pressure of the liquid in the second channel 202, and the collecting channel 140 and the pump inlet channel 170 may be connected together via the second pressure adjusting unit 150. In other words, the supply port 501 connects to the second channel 202, and the discharge port 502 connects to the first channel 201, which enables the piezoelectric pump 500 to make the liquid in the second channel 202 flow into the first channel 201.

Thus, this embodiment allows the piezoelectric pump 500 to circulate liquid along the circulation path formed in the liquid discharge head 1. This makes it possible to reduce or eliminate ink thickening and deposition of sedimentation components of the color materials of the ink in the discharge module 300, allowing the ink flowability and the discharge characteristics at the discharge port 13 in the discharge module 300 to be kept in good condition.

The circulation path in this embodiment is completed in the liquid discharge head 1. This configuration reduces the circulation path length remarkably as compared with a configuration in which ink is circulated between the liquid discharge head 1 and the ink tank 2 provided outside the liquid discharge head 1. This allows circulation of ink to be performed with a compact piezoelectric pump.

The discharge head 1 and the ink tank 2 are connected only with an ink supply channel. In other words, a channel for collecting ink from the liquid discharge head 1 into the ink tank 2 is not needed. This requires only an ink supply tube to connect the ink tank 2 and the liquid discharge head 1 eliminates the need for an ink collecting tube. This allows the interior of the liquid discharge apparatus 50 to be simple with reduced number of tubes, thereby reducing the size of the entire apparatus. The reduction of the number of tubes allows reduction of pressure fluctuations of the ink due to vibration of the tubes with the main scanning of the liquid discharge head 1. The vibration of the tubes during the main scanning of the liquid discharge head 1 acts as a drive load on the carriage motor 105 that drives the carriage 60. The reduction of the number of tubes reduces the drive load on the carriage motor 105 and simplifies the main scanning mechanism including the carriage motor 105. This configuration eliminates the need for collecting the ink from the liquid discharge head 1 to the ink tank 2, allowing reduction in the size of the external pump 21. Thus, this embodiment can reduce the size and cost of the liquid discharge apparatus 50.

Pressure Adjusting Unit

Figures 19A, 19B, 19C:
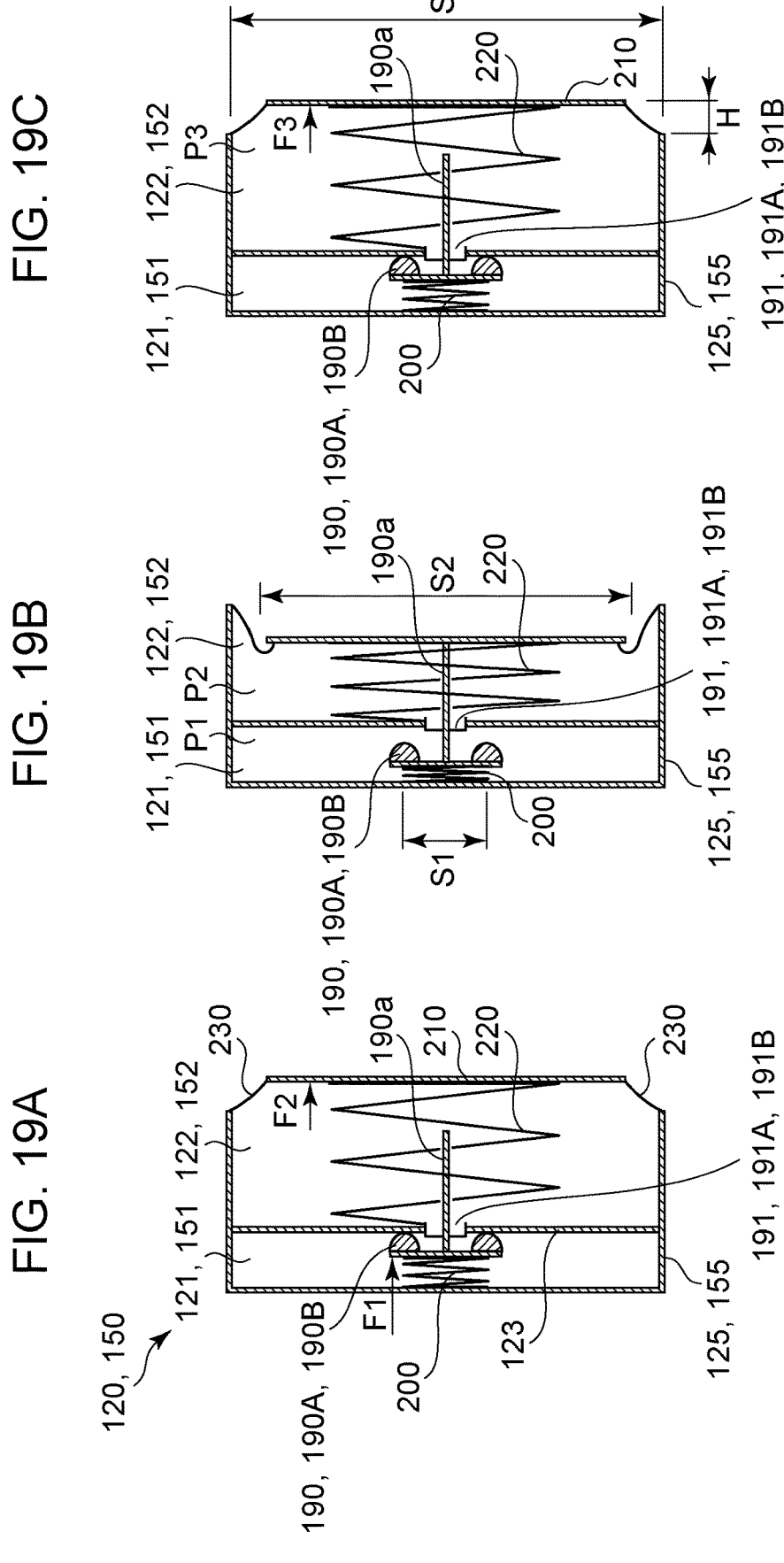
FIG. 19A is a cross-sectional view of an example of a pressure adjusting unit in a closed state.
FIG. 19B is a cross-sectional view of an example of the pressure adjusting unit in an open state.
FIG. 19C is a cross-sectional view of an example of the pressure adjusting unit in a closed state.

FIGS. 19A to 19C illustrate an example the pressure adjusting unit. Referring to FIGS. 19A to 19C, the configuration and operation of the pressure adjusting units (the first pressure adjusting unit 120 and the second pressure adjusting unit 150) housed in the liquid discharge head 1 will be described in more detail. The first pressure adjusting unit 120 and the second pressure adjusting unit 150 have substantially the same configuration. For this reason, the first pressure adjusting unit 120 will be described as an example, and for the second pressure adjusting unit 150, signs corresponding to the first pressure adjusting unit 120 will be written side by side in FIGS. 19A to 19C. In the case of the second pressure adjusting unit 150, the first valve chamber 121, described below, is read as the second valve chamber

151, and the first pressure control chamber 122 is read as the second pressure control chamber 152.

The first pressure adjusting unit 120 includes the first valve chamber 121 and the first pressure control chamber 122 formed in a cylindrical casing 125. The first valve chamber 121 and the first pressure control chamber 122 are separated from each other by a partition 123 provided in the cylindrical casing 125. The first valve chamber 121 communicates with the first pressure control chamber 122 via a communication port 191 formed in the partition 123. The first valve chamber 121 includes a valve 190 that switches between the communication and discommunication between the first valve chamber 121 and the first pressure control chamber 122 at the communication port 191. The valve 190 is held at a position facing the communication port 191 by a valve spring 200 and can be brought into close-contact with the partition 123 by the urging force of the valve spring 200. The close-contact of the valve 190 with the partition 123 cuts off the ink flow at the communication port 191. To enhance the closeness to the partition 123, the portion of the valve 190 to come into contact with the partition 123 may be made of an elastic member. The valve 190 has, at the center, a valve shaft 190a passing through the communication port 191. Pushing the valve shaft 190a against the urging force of the valve spring 200 separates the valve 190 from the partition 123, allowing the ink to flow through the communication port 191. A state in which the ink flow is cut off at the communication port 191 by the valve 190 is referred to as "closed state", and a state in which ink can flow through the communication port 191 is referred to as "open state".

The openings of the cylindrical casing 125 are closed by flexible members 230 and a pressure plate 210. The flexible members 230, the pressure plate 210, the peripheral wall of the casing 125, and the partition 123 form the first pressure control chamber 122. The pressure plate 210 is displaceable with the displacement of the flexible members 230. The pressure plate 210 and the flexible members 230 may be made of any material. For example, the pressure plate 210 may be made of a resin molded member, and the flexible members 230 may be made of resin film. In this case, the pressure plate 210 can be fixed to the flexible members 230 by thermal fusion.

A pressure adjusting spring 220 (an urging member) is provided between the pressure plate 210 and the partition 123. The urging force of the pressure adjusting spring 220 urges the pressure plate 210 and the flexible members 230 in the direction in which the capacity of the first pressure control chamber 122 increases, as shown in FIG. 19A. A decrease in the pressure in the first pressure control chamber 122 causes the pressure plate 210 and the flexible members 230 to be displaced in the direction in which the capacity of the first pressure control chamber 122 decreases against the pressure of the pressure adjusting spring 220. A decreased in the capacity of the first pressure control chamber 122 to a fixed amount causes the pressure plate 210 to come into contact with the valve shaft 190a of the valve 190. A further decrease in the capacity of the first pressure control chamber 122 causes the valve 190 to move together with the valve shaft 190a against the urging force of the valve spring 200 to come away from the partition 123. This brings the communication port 191 to the open state (the state in FIG. 19B).

In this embodiment, the connection in the circulation path is set so that the pressure in the first valve chamber 121 when the communication port 191 is in the open state becomes higher than the pressure in the first pressure control chamber 122.

When the communication port 191 comes to the open state, the ink flows from the first valve chamber 121 into the first pressure control chamber 122. The ink flow causes the flexible members 230 and the pressure plate 210 to be displaced in the direction in which the capacity of the first pressure control chamber 122 increases. As a result, the pressure plate 210 is separated from the valve shaft 190a of the valve 190, and the valve 190 is brought into close-contact with the partition 123 by the urging force of the valve spring 200, and thus the communication port 191 comes to the closed state (the state in FIG. 19C).

Thus, in the first pressure adjusting unit 120 of this embodiment, when the pressure in the first pressure control chamber 122 decreases to a fixed pressure or less (for example, negative pressure is increased), the ink flows from the first valve chamber 121 into the first pressure control chamber 122 via the communication port 191. For this reason, the first pressure adjusting unit 120 is configured so that the pressure in the first pressure control chamber 122 is not decreased any more. Accordingly, the pressure in the first pressure control chamber 122 is controlled within a fixed range.

Next, the pressure in the first pressure control chamber 122 will be described in more detail.

Assume that the flexible members 230 and the pressure plate 210 are displaced according to the pressure in the first pressure control chamber 122 to bring the pressure plate 210 into contact with the valve shaft 190a to bring the communication port 191 into the open state (the state in FIG. 19B), as described above. The relationship between the forces acting on the pressure plate 210 at that time is expressed as Eq. 1.

$$P2 \times S2 + F2 + (P1 - P2) \times S1 + F1 = 0 \qquad \text{Eq.1}$$

If Eq. 1 is rearranged for P2, $$P2 = -(F1 + F2 + P1 \times S1)/(S2 - S1) \qquad \text{Eq. 2}$$

P1: Pressure (gauge pressure) in the first valve chamber 121

P2: Pressure (gauge pressure) in the first pressure control chamber 122

F1: Spring force of the valve spring 200

F2: Spring force of the pressure adjusting spring 220

S1: Pressure receiving area of the valve 190

S2: Pressure receiving area of the pressure plate 210

Here, the spring force F1 of the valve spring 200 and the spring force F2 of the pressure adjusting spring 220 are positive in the direction of pushing the valve 190 and the pressure plate 210 (to the right in FIGS. 19A to 19C). The pressure P1 of the first valve chamber 121 and the pressure P2 of the first pressure control chamber 122 are set to satisfy the relation P1≥P2

The pressure P2 in the first pressure control chamber 122 when the communication port 191 comes to the open state is determined by Eq. 2. When the communication port 191 comes to the open state, the ink flows from the first valve chamber 121 into the first pressure control chamber 122 because of the relation of P1<@>>=</@>P2. As a result, the pressure P2 in the first pressure control chamber 122 does not decrease any more and is kept at a pressure within a fixed range.

In contrast, the relation between the forces acting on the pressure plate 210 when the pressure plate 210 comes out of contact with the valve shaft 190a to bring the communication port 191 to the closed state, as shown in FIG. 19C, is expressed as Eq. 3.

$$P3 \times S3 + F3 = 0 \qquad \text{Eq. 3}$$

If Eq. 3 is rearranged for P3, $$P3 = -F3/S3 \qquad \text{Eq. 4}$$

F3: Spring force of the pressure adjusting spring 220 when the pressure plate 210 and the valve shaft 190a are not in contact with each other P3: Pressure (gauge pressure) of the first pressure control chamber 122 when the pressure plate 210 and the valve shaft 190a are not in contact with each other S3: Pressure receiving area of the pressure plate 210 when the pressure plate 210 and the valve 190 are not in contact with each other FIG. 19C shows a state in which the pressure plate 210 and the flexible members 230 are displaced to the right in the drawing to a displaceable limit. The pressure P3 in the first pressure control chamber 122, the spring force F3 of the pressure adjusting spring 220, and the pressure receiving area S3 of the pressure plate 210 change according to the amount of displacement of the pressure plate 210 and the flexible members 230 to the state shown in FIG. 19C. Specifically, when the pressure plate 210 and the flexible members 230 are closer to the left in FIG. 19B than in FIG. 19C, the pressure receiving area S3 of the pressure plate 210 decreases, and the spring force F3 of the pressure adjusting spring 220 increases. As a result, the pressure P3 in the first pressure control chamber 122 decreases because of the relation of Eq. 4. Accordingly, the pressure in the first pressure control chamber 122 increases gradually during the period from the state in FIG. 19B to the state in FIG. 19C because of the relations of Eq. 2 and Eq. 4 (that is, the negative pressure decreases to a positive pressure). In other words, the pressure plate 210 and the flexible members 230 are gradually displaced to the right from the state in which the communication port 191 is in the open state, and the pressure in the first pressure control chamber increases gradually until the capacity of the first pressure control chamber 122 reaches a displaceable limit finally. That is, the negative pressure decreases.

Ink Flow in Liquid Discharge Head

FIGS. 20A to 20E are diagrams illustrating the ink flow in the liquid discharge head 1. Referring to FIGS. 20A to 20E, the circulation of ink in the liquid discharge head 1 will be described. FIG. 20A schematically shows the ink flow in a recording operation for discharging ink from the discharge port 13 for recording. The arrows in the drawings indicate the flow of ink. In this embodiment, both the external pump 21 and the piezoelectric pump 500 start driving in a recording operation. The external pump 21 and the piezoelectric pump 500 may be driven regardless of the recoding operation. The driving of the external pump 21 and the piezoelectric pump 500 do not have to be operably connected. They may be driven independently.

During the recording operation, the piezoelectric pump 500 is in ON state (driven state) in which the ink flowing out of the first pressure control chamber 122 flows into the supply channel 130 and the bypass channel 160. The ink flowing into the supply channel 130 passes through the discharge module 300 into the collecting channel 140 and is then supplied to the second pressure control chamber 152.

In contrast, the ink flowing from the first pressure control chamber 122 into the bypass channel 160 passes through the second valve chamber 151 into the second pressure control chamber 152. The ink flowing into the second pressure control chamber 152 passes through the pump inlet channel 170, the piezoelectric pump 500, and the pump outlet channel 180 and flows into the first pressure control chamber 122 again. At that time, the control pressure of the first valve chamber 121 is set higher than the control pressure of the first pressure control chamber 122 on the basis of the relation of Eq. 2 described above. Accordingly, the ink in the first pressure control chamber 122 is supplied to the discharge module 300 again through the supply channel 130 without flowing into the first valve chamber 121. The ink flowing into the discharge module 300 passes through the collecting channel 140, the second pressure control chamber 152, the pump inlet channel 170, the piezoelectric pump 500, and the pump outlet channel 180 and flows into the first pressure control chamber 122 again. Thus, ink circulation completed in the liquid discharge head 1 is performed.

In the above ink circulation, the amount (flow rate) of ink circulated in in the discharge module 300 is determined by the difference in control pressure between the first pressure control chamber 122 and the second pressure control chamber 152. The pressure difference is set to provide such a circulation amount that the ink thickening in the vicinity of the discharge port 13 in the discharge module 300 can be prevented. The ink corresponding to the amount of ink consumed by recording is supplied from the ink tank 2 to the first pressure control chamber 122 through the filter 110 and the first valve chamber 121. How the consumed ink is made up will be described in detail. Since the ink decreases from the interior of the circulation path by an amount corresponding to the ink consumed by recording, the pressure in the first pressure control chamber 122 decreases, and as a consequence, the ink in the first pressure control chamber 122 also decreases. As the ink in the first pressure control chamber 122 decreases, the capacity of the first pressure control chamber 122 decreases. The decrease in the capacity of the first pressure control chamber 122 causes the communication port 191A to come to the open state, and the ink is supplied from the first valve chamber 121 to the first pressure control chamber 122. This supplied ink loses in pressure while passing moving from the first valve chamber 121 through the communication port 191A into the first pressure control chamber 122. This causes the ink in the positive pressure to switch to a negative pressure. The inflow of the ink from the first valve chamber 121 to the first pressure control chamber 122 increases the pressure in the first pressure control chamber 122 to increases the capacity in the first pressure control chamber 122, causing the communication port 191A to come to the closed state. Thus, the communication port 191A repeats the open state and the closed state according to the consumption of the ink. If no ink is consumed, the communication port 191A is kept in the closed state.

FIG. 20B schematically shows an ink flow immediately after the recording operation ends, and the piezoelectric pump 500 comes to OFF state (stopped state). At the end of the recording operation, when the piezoelectric pump 500 is turned off, both the pressure in the first pressure control chamber 122 and the pressure in the second pressure control chamber 152 are in the controlled pressure during the recording operation. This causes the ink to move as in FIG. 20B according to the difference in pressure between the first pressure control chamber 122 and the second pressure control chamber 152. Specifically, an ink flow from the first pressure control chamber 122 to the discharge module 300 through the supply channel 130 and thereafter passing through the collecting channel 140 to the second pressure control chamber 152 is continuously generated. An ink flow from the first pressure control chamber 122 to the second pressure control chamber 152 through the bypass channel 160 and the second valve chamber 151 is also continued.

The amount of ink corresponding to the amount of ink moved from the first pressure control chamber 122 to the second pressure control chamber 152 by the ink flows is supplied from the ink tank 2 to the first pressure control chamber 122 through the filter 110 and the first valve chamber 121. This allows the content in the first pressure control chamber 122 to be kept constant. When the content in the first pressure control chamber 122 is constant, the spring force F1 of the valve spring 200, the spring force F2 of the pressure adjusting spring 220, the pressure receiving area 51 of the valve 190, and the pressure receiving area S2 of the pressure plate 210 are kept constant from the relation in Eq. 2 described above. For this reason, the pressure in the first pressure control chamber 122 is determined according to a change in the pressure (gauge pressure) P1 in the first valve chamber 121. Accordingly, if the pressure P1 in the first valve chamber 121 does not change, the pressure P2 in the first pressure control chamber 122 is kept at the same pressure as the control pressure in the recording operation.

The pressure in the second pressure control chamber 152 changes with time according to a change in content caused by the ink flow from the first pressure control chamber 122. Specifically, the pressure in the second pressure control chamber 152 changes from the state in FIG. 20B according to Eq. 2 during the period until the communication port 191 comes to the closed state so that the second valve chamber 151 and the second pressure control chamber 152 come to a noncommunicating state, as shown in FIG. 20C. Thereafter, the pressure plate 210 and the valve shaft 190a come to a non-contact state to bring the communication port 191 to the closed state. Then, the ink flows from the collecting channel 140 into the second pressure control chamber 152, as shown in FIG. 20D. The ink flow causes the pressure plate 210 and the flexible members 230 to be displaced, and the pressure in the second pressure control chamber 152 changes, that is, increases, until the capacity of the second pressure control chamber 152 becomes maximum according to Eq. 4.

In the state in FIG. 20C, the ink flow from the first pressure control chamber 122 through the bypass channel 160 and the second valve chamber 151 to the second pressure control chamber 152 does not occur. Accordingly, only a flow of ink from the first pressure control chamber 122 through the supply channel 130, the discharge module 300, and the collecting channel 140 into the second pressure control chamber 152 is generated.

The movement of the ink from the first pressure control chamber 122 to the second pressure control chamber 152 occurs according to the pressure difference between the first pressure control chamber 122 and the second pressure control chamber 152, as described above.

Therefore, when the pressure in the second pressure control chamber 152 becomes equal to the pressure in the first pressure control chamber 122, the movement of the ink stops.

In the state in which the pressure in the second pressure control chamber 152 is equal to the pressure in the first pressure control chamber 122, the second pressure control chamber 152 expands to the state shown in FIG. 20D. The expansion of the second pressure control chamber 152 as shown in FIG. 20D forms an ink reservoir in the second pressure control chamber 152. The time from the stop of the piezoelectric pump 500 to the state in FIG. 20D, which depends on the shape and size of the channels and properties of the ink, is about 1 to 2 minutes. When the piezoelectric pump 500 is driven from the state in FIG. 20D in which the ink is stored in the reservoir, the ink in the reservoir is supplied to the first pressure control chamber 122 by the piezoelectric pump 500. This causes the amount of the ink in the first pressure control chamber 122 to be increased and the flexible members 230 and the pressure plate 210 to be displaced in the expanding direction, as shown in FIG. 20E. When the driving of the piezoelectric pump 500 is continued, the state in the circulation path changes, as shown in FIG. 20A.

Although FIG. 20A is an example during a recording operation, the ink may be circulated without the recording operation. In this case also, the ink flow as shown in FIGS. 20A to 20E occurs in response to the drive and stop of the piezoelectric pump 500.

In this embodiment, the communication port 191B of the second pressure adjusting unit 150 comes into the open state when the piezoelectric pump 500 is driven to circulate the ink, and comes into the closed state when the ink circulation is stopped, as described above. This is given for mere illustrative purposes. The control pressure may be set so that, even when the piezoelectric pump 500 is driven to circulate the ink, the communication port 191B of the second pressure adjusting unit 150 is in the closed state. This will be described specifically together with the role of the bypass channel 160.

The bypass channel 160 connecting the first pressure adjusting unit 120 and the second pressure adjusting unit 150 together is provided to prevent a negative pressure generated in the circulation path, if higher than a predetermined value, from affecting the discharge module 300. The bypass channel 160 is provided also to supply the ink to the pressure chambers 12 from both the supply channel 130 and the collecting channel 140. In other words, the bypass channel 160 makes the first channel 201 and the second channel 202 communicate not via the pressure chamber 12.

First, an example in which the bypass channel 160 is provided to prevent a negative pressure higher than a predetermined value from affecting the discharge module 300 will be described. For example, the properties (for example, viscosity) of the ink can be changed by a change in ambient temperature. The change in the viscosity of the ink causes a change in the pressure loss in the circulation path. For example, a decrease in the viscosity of the ink decreases the pressure loss in the circulation path. This increases the flow rate of the piezoelectric pump 500 driven at a constant driving amount, thereby increasing the flow rate of the discharge module 300. In contrast, the discharge module 300 is kept at a fixed temperature by a temperature adjusting mechanism (not shown), so that the viscosity of the ink in the discharge module 300 is kept constant even if the ambient temperature changes. Since the viscosity of the ink in the discharge module 300 does not change, and the flow rate of the ink flowing in the discharge module 300 increases, the negative pressure in the discharge module 300 is increased because of the flow resistance. The negative pressure in the discharge module 300 higher than the predetermined value may break the meniscus at the discharge port 13 to attract the external air into the circulation path, hindering normal discharge. Even if the meniscus is not broken, the negative pressure in the pressure chambers 12 becomes higher than the predetermined pressure, which may affect the discharge.

For this reason, this embodiment includes the bypass channel 160 in the circulation path. The bypass channel 160 allows the ink to flow therethrough when the negative pressure is higher than a predetermined value, allowing the pressure in the discharge module 300 to be kept constant. Accordingly, the control pressure of the second pressure adjusting unit 150 may be set so that the communication port 191B can be kept in the closed state even if the piezoelectric pump 500 is in operation. The control pressure of the second pressure adjusting unit 150 may be set so that the communication port 191B of the second pressure adjusting unit 150 comes to the open state when the negative pressure becomes higher than the predetermined value. In other words, provided that the meniscus is not broken, or a predetermined negative pressure is maintained even if the flow rate of the piezoelectric pump 500 is changed because of a change in viscosity due to an environmental change, the communication port 191B may be in the closed state when the piezoelectric pump 500 is in operation.

Next, an example in which the bypass channel 160 is provided to supply ink to the pressure chamber 12 from both the supply channel 130 and the collecting channel 140 will be described. A pressure change in the circulation path can be generated also by a discharge operation using the discharge element 15. This is because the discharge operation causes a force to attract the ink to the pressure chamber 12. The duty, which depends of various conditions, is set at 100% in a state in which a 4-pl ink drop is recorded on a grid of 1,200 dpi. High-duty recording is recording at, for example, a duty of 100%.

The point that, for high-duty recording, ink is supplied to the pressure chamber 12 from both the supply channel 130 and the collecting channel 140 will be described.

Continuous high-duty recording decreases the amount of ink flowing from the pressure chambers 12 into the second pressure control chamber 152 through the collecting channel 140 decreases. Meanwhile, the piezoelectric pump 500 lets the ink flow at a constant amount. This unbalances the inflow and outflow in the second pressure control chamber 152 to decrease the ink in the second pressure control chamber 152, increasing the negative pressure in second pressure control chamber 152, thereby contracting the second pressure control chamber 152. The increase in the negative pressure in the second pressure control chamber 152 increases the amount of ink flowing into the second pressure control chamber 152 through the bypass channel 160, balancing the outflow and inflow of the second pressure control chamber 152. Thus, the negative pressure in the second pressure control chamber 152 increases in response to the duty. In the configuration in which the communication port 191B is in the closed state when the piezoelectric pump 500 is in operation, the communication port 191B goes to the open state according to the duty, so that the ink flows from the bypass channel 160 into the second pressure control chamber 152.

Further continuation of high-duty recording decreases the amount of ink flowing from the pressure chamber 12 into the second pressure control chamber 152 through the collecting channel 140, and instead, increases the amount of ink flowing into the second pressure control chamber 152 through the bypass channel 160 via the communication port 191B. Still further continuation of this state reduces the amount of ink flowing from the pressure chamber 12 into the second pressure control chamber 152 through the collecting channel 140 into zero, and the whole of the ink flowing to the piezoelectric pump 500 comes from the communication port 191B. Still further continuation causes the ink to flow back from the second pressure control chamber 152 into the pressure chamber 12 through the collecting channel 140. In this state, the ink flowing out of the second pressure control chamber 152 into the piezoelectric pump 500 and the ink flowing into the pressure chamber 12 flows into the second pressure control chamber 152 via the communication port 191B through the bypass channel 160. In this case, the pressure chamber 12 is filled with the ink from the supply channel 130 and the ink from the collecting channel 140 and is then discharged.

The backflow of the ink that occurs at high recording duty is a phenomenon caused by the presence of the bypass channel 160. The above is an example in which the communication port 191B in the second pressure adjusting unit comes to the open state with the backflow of the ink. The backflow of the ink can occur in a state in which the communication port 191B in the second pressure adjusting unit is in the open state. Even in a configuration without the second pressure adjusting unit, the presence of the bypass channel 160 can cause the backflow of ink.

Configuration of Discharge Unit

Figure 21A:
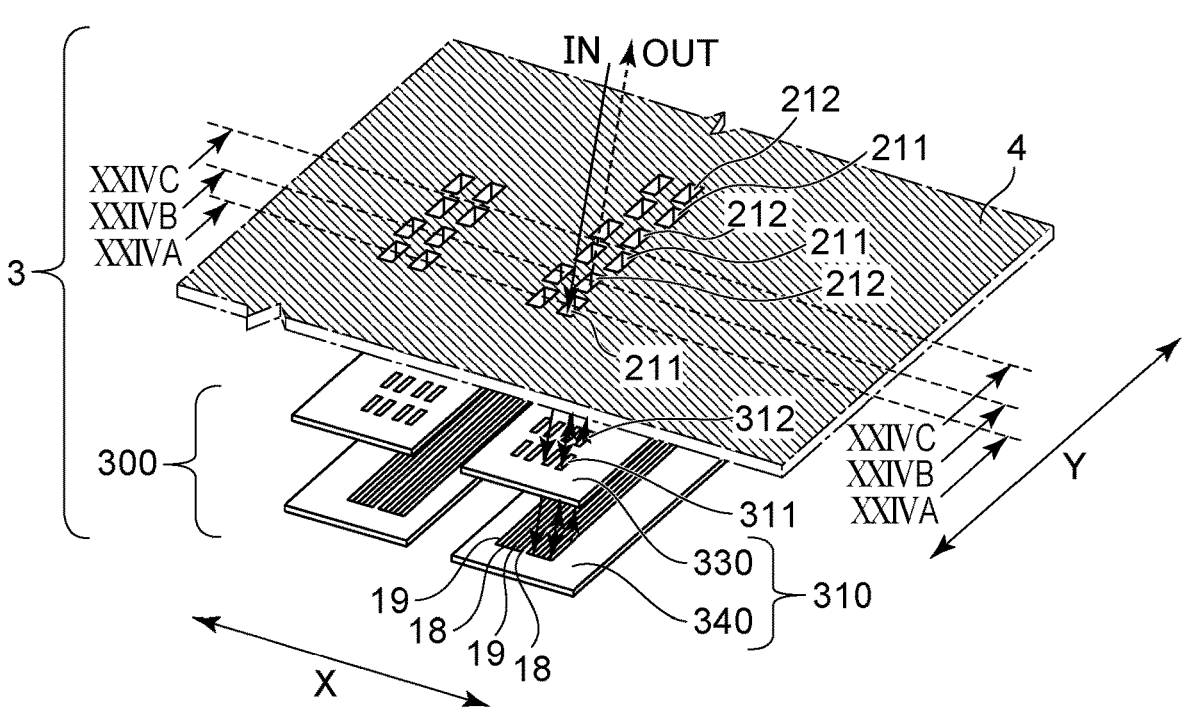
FIG. 21A is a top view of the circulation path of a discharge unit.
Figure 21B:
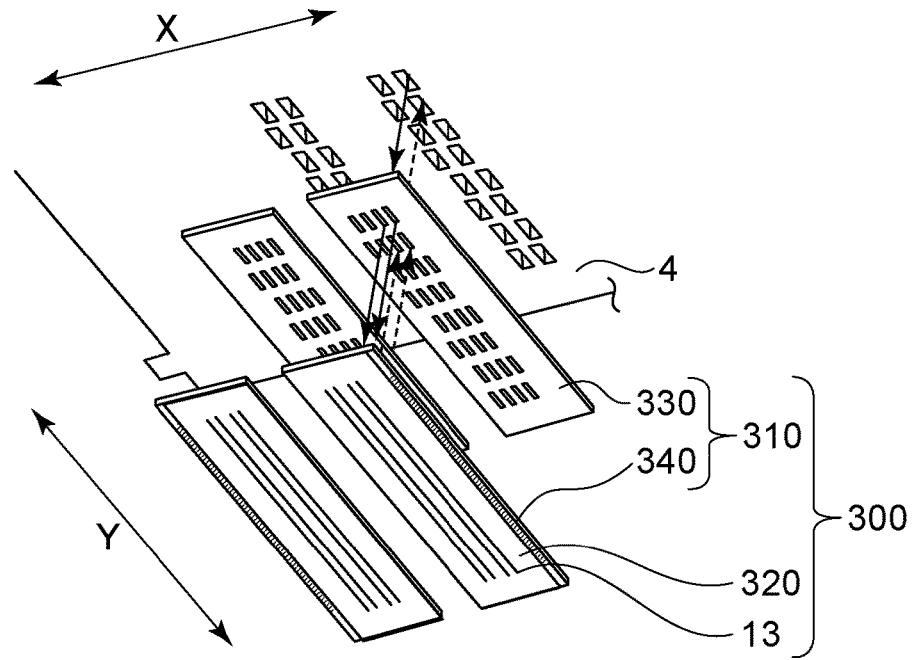
FIG. 21B is a bottom view of the circulation path of a discharge unit.
Figure 22:
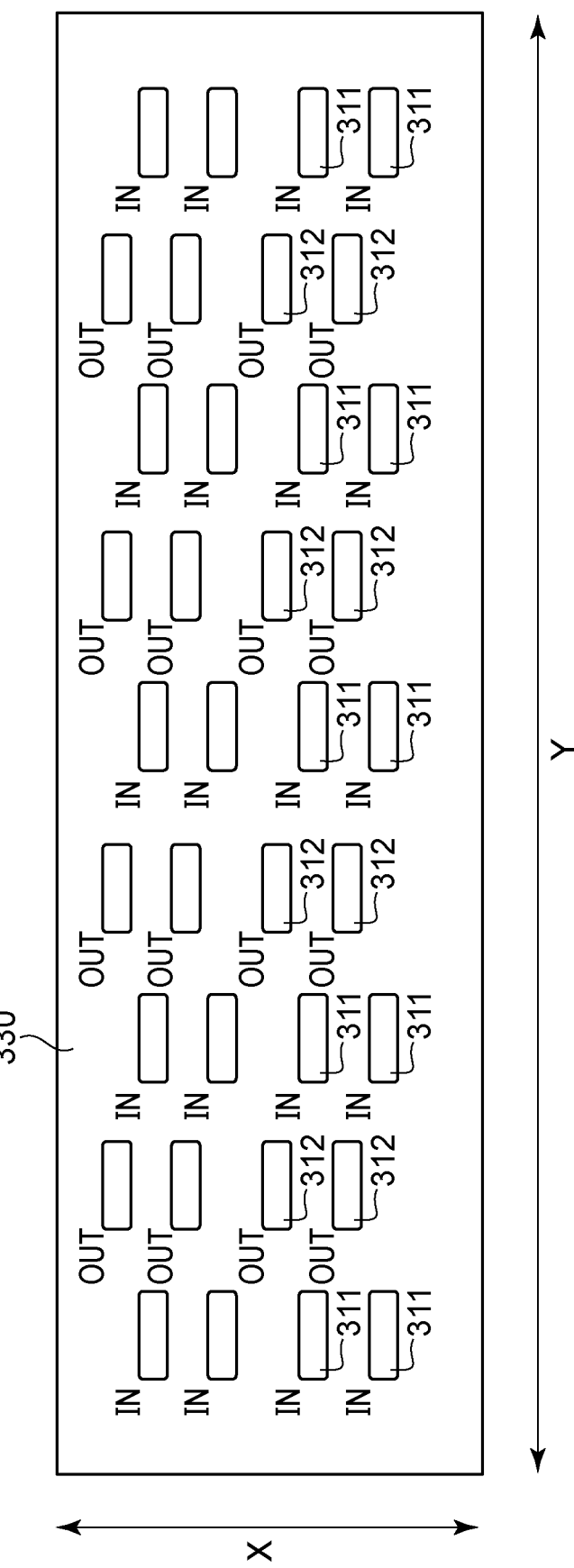
FIG. 22 is a diagram illustrating an opening plate.
Figure 23:
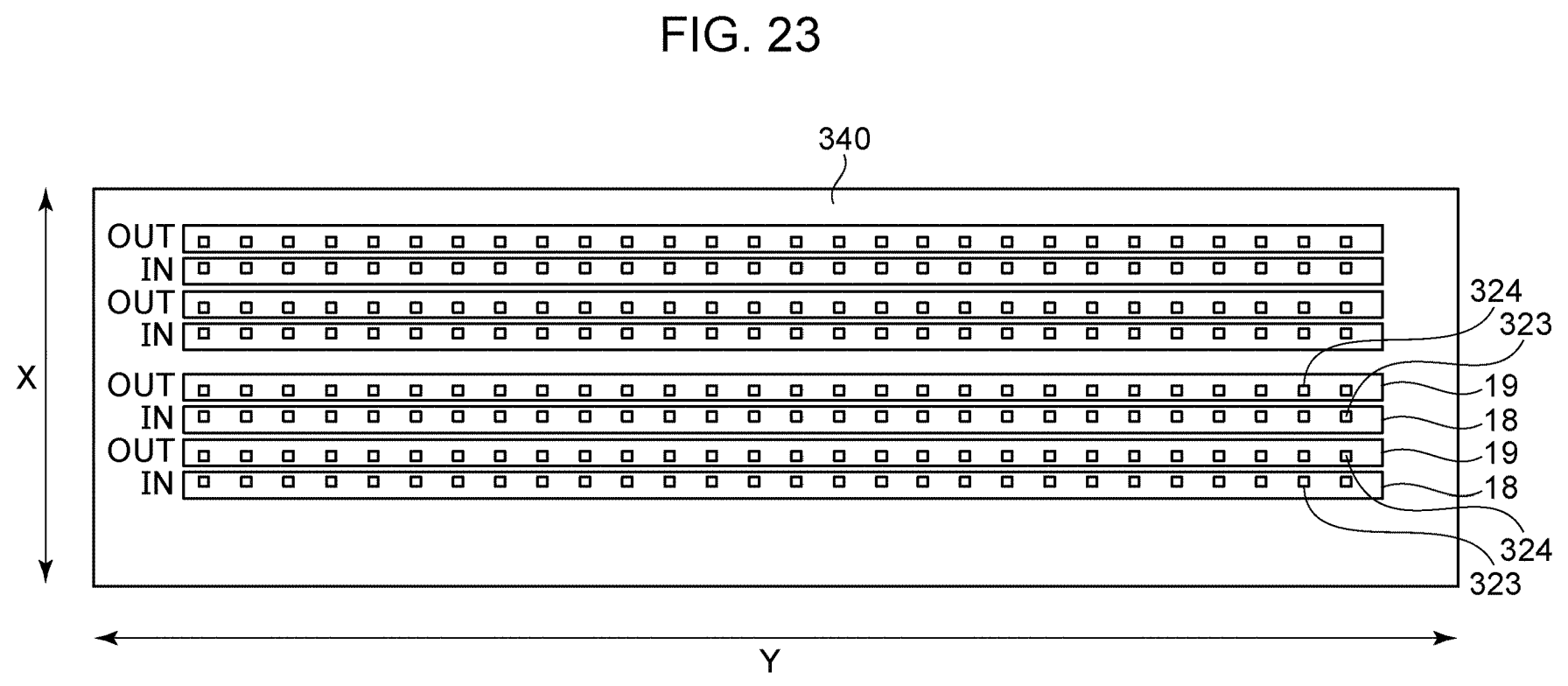

FIGS. 21A and 21B are schematic diagrams of the circulation path for one color ink in the discharge unit 3 of this embodiment. FIG. 21A is an exploded perspective view of the discharge unit 3 seen from the first supporting member 4. FIG. 21B is an exploded perspective view of the discharge unit 3 seen from the discharge module 300. The arrows denoted as IN and OUT in FIG. 21A indicate ink flows. Although the ink flows are illustrated only for one color, this also applies to the other colors. The second supporting member 7 and the electrical wiring member 5 are omitted in FIGS. 21A and 21B, as well as in the following description of the discharge unit 3. The first supporting member 4 in FIG. 21A is shown in cross section taken along line XXIA-XXIA in FIG. 15A. The discharge module 300 includes a discharge element substrate 340 and an opening plate 330. FIG. 22 is a diagram illustrating the opening plate 330. FIG. 23 is a diagram illustrating the discharge element substrate 340.

The discharge unit 3 is supplied with ink from the circulation unit 54 via the joint member 8 (see FIG. 15A). An ink path after the ink passes through the joint member 8 until the ink returns to the joint member 8 will be described. In FIGS. 21A and 21B, the joint member 8 is omitted.

The discharge module 300 includes the discharge element substrate 340 and the opening plate 330 constituting the silicon substrate 310 and further includes the discharge-port formed member 320. The discharge element substrate 340, the opening plate 330, and the discharge-port formed member 320 are joined together so that the ink channels communicate to form the discharge module 300, and the discharge module 300 is supported by the first supporting member 4. The discharge module 300 is supported by the first supporting member 4 to form the discharge unit 3. The discharge element substrate 340 includes the discharge-port formed member 320 including a plurality of discharge port arrays in which the plurality of discharge ports 13 is arrayed and discharges part of the ink supplied through the ink channel in the discharge module 300 from the discharge ports 13. Ink that was not discharged is collected through the ink channel in the discharge module 300.

As shown in FIGS. 21A and 22, the opening plate 330 includes a plurality of arrayed ink supply ports 311 and a plurality of arrayed ink collecting ports 312. As shown in FIG. 23 and FIGS. 24A to 24C, the discharge element substrate 340 includes a plurality of arrayed supply connecting channels 323 and a plurality of arrayed collection connecting channels 324. The discharge element substrate 340 further includes the common supply channels 18 each communicating with the plurality of supply connecting channels 323 and the common collecting channels 19 each communicating with the plurality of collection connecting channels 324. The ink channels in the discharge unit 3 are formed by connecting the ink supply channels 48 and the ink collecting channels 49 (see FIG. 15A) in the first supporting member 4 with the channels in the discharge module 300. Supporting member supply ports 211 are cross-sectional openings forming the ink supply channels 48 and supporting member collection ports 212 are cross-sectional openings forming the ink collecting channels 49.

The ink to be supplied to the discharge unit 3 is supplied through the circulation unit 54 (FIG. 15A) to the ink supply channel 48 (FIG. 15A) in the first supporting member 4. The ink flowing through the supporting member supply port 211 in the ink supply channel 48 is supplied to the common supply channel 18 in the discharge element substrate 340 through the ink supply channel 48 (FIG. 15A) and the ink supply port 311 of the opening plate 330 into the supply connecting channel 323. This is a supply channel. Thereafter, the ink passes through the pressure chamber 12 (see FIG. 15B) of the discharge-port formed member 320 into the collection connecting channel 324 of the collection channel. The details of the ink flow in the pressure chamber 12 will be described below.

In the collecting channel, the ink that has entered the collection connecting channel 324 flows to the common collecting channel 19. Thereafter, the ink flows from the common collecting channel 19 to the ink collecting channel 49 in the first supporting member 4 via the ink collecting port 312 of the opening plate 330 and is collected to the circulation unit 54 through the supporting member collection port 212.

Areas of the opening plate 330 having no ink supply ports 311 and no ink collecting ports 312 correspond to areas of the first supporting member 4 separating the supporting member supply ports 211 and the supporting member collection ports 212. The areas of the first supporting member 4 have no opening. These areas are used as bonding areas in bonding the discharge module 300 and the first supporting member 4 together.

In FIG. 22, the opening plate 330 includes a plurality of arrays of openings, which are arrayed in the X-direction, in the Y-direction, in which supply (IN) openings and collecting (OUT) openings are alternately arrayed in the Y-direction so as to be half a pitch out of alignment in the X-direction. In FIG. 23, the discharge element substrate 340 includes the common supply channels 18 each communicating with the plurality of supply connecting channels 323 arrayed in the Y-direction and the common collecting channels 19 each communicating with the plurality of collection connecting channels 324 arrayed in the Y-direction. The common supply channels 18 and the common collecting channels 19 are alternately arrayed in the X-direction. The common supply channels 18 and the common collecting channels 19 are separated for each type of ink, and the number of the common supply channels 18 and the number of the common collecting channels 19 are determined according to the number of discharge port arrays for each color. The supply connecting channels 323 and the collection connecting channels 324 are also disposed in number corresponding to the discharge ports 13. The supply connecting channels 323 and the collection connecting channels 324 do not necessarily have to be in one-to-one correspondence with the discharge ports 13. One supply connecting channel 323 and one collection connecting channel 324 may be provided for a plurality of discharge ports 13.

The opening plate 330 and the discharge element substrate 340 are overlapped and joined together so that the ink channels communicate to constitute the discharge module 300 and are supported by the first supporting member 4, thereby forming the ink channel including the supply channel and the collecting channel described above.

Figure 24A:
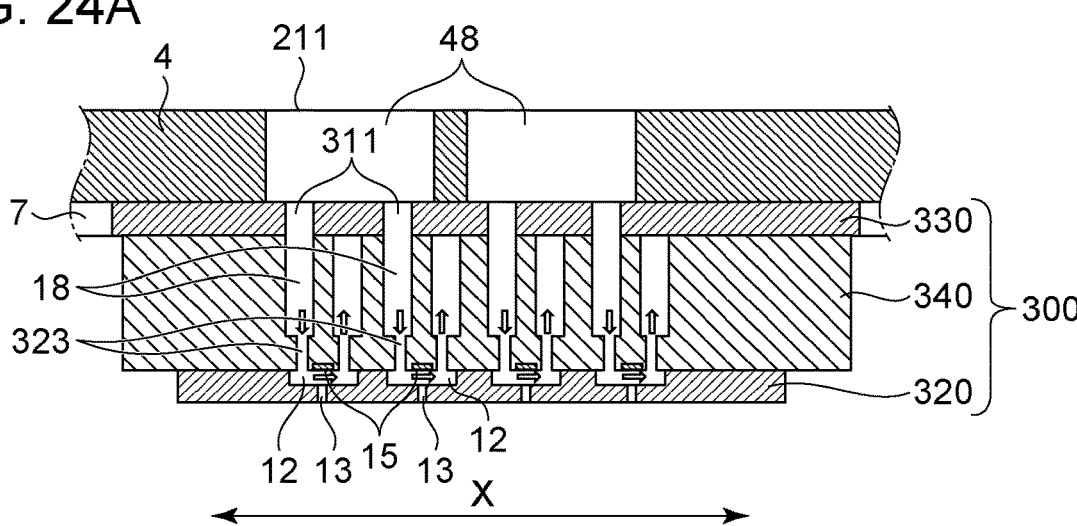
FIG. 24A is a cross-sectional view of the discharge unit in FIG. 21A taken along line XXIVA-XXIVA.
Figure 24B:
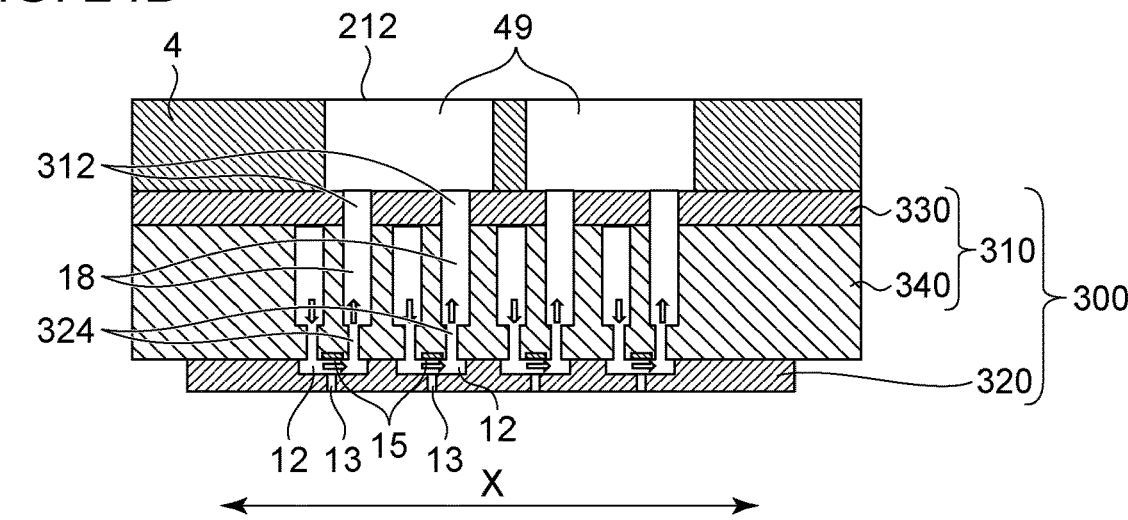
FIG. 24B is a cross-sectional view of the discharge unit in FIG. 21A taken along line XXIVB-XXIVB.
Figure 24C:
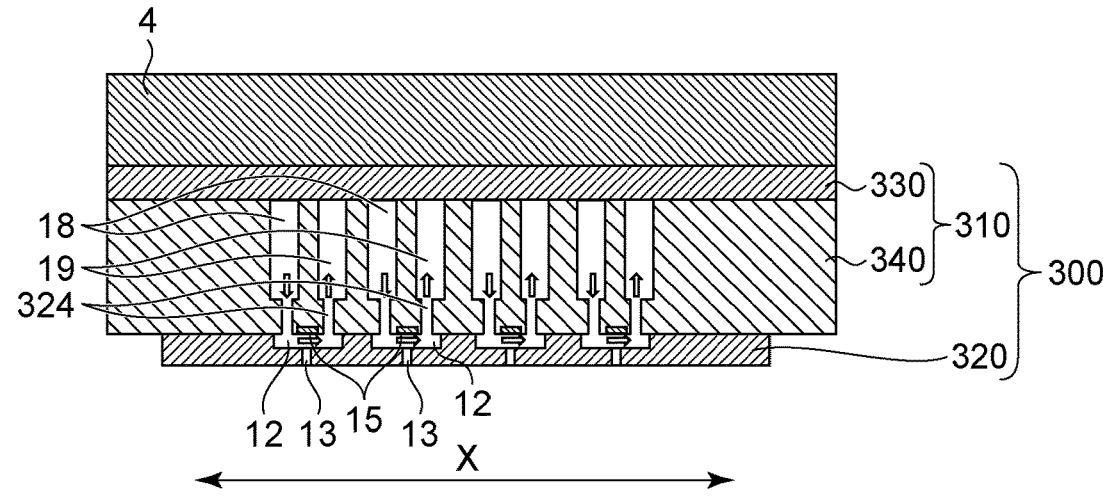
FIG. 24C is a cross-sectional view of the discharge unit in FIG. 21A taken along line XXIVC-XXIVC.

FIGS. 24A to 24C are cross-sectional views of the discharge unit 3 illustrating ink flows in different portions. FIG. 24A is a cross-sectional view of FIG. 21A taken along line XXIVA-XXIVA illustrating a cross section of a portion of the discharge unit 3 where the ink supply channels 48 and the ink supply ports 311 communicate with each other. FIG. 24B is a cross-sectional view of FIG. 21A taken along line XXIVB-XXIVB illustrating a cross section of a portion of the discharge unit 3 where the ink collecting channels 49 and the ink collecting ports 312 communicate with each other. FIG. 24C is a cross-sectional view of FIG. 21A taken along line XXIVC-XXIVC illustrating a cross section of a portion of the discharge unit 3 where the ink supply ports 311 and the ink collecting ports 312 do not communicate with the channels in the first supporting member 4.

In the supply channels for supplying ink, the ink is supplied from the portions where the ink supply channels 48 of the first supporting member 4 and the ink supply ports 311 of the opening plate 330 overlap and communicate with each other, as shown FIG. 24A. In the collecting channels for collecting ink, the ink is collected from the portions where the ink collecting channels 49 of the first supporting member 4 and the ink collecting ports 312 of the opening plate 330 overlap and communicate with each other, as shown in FIG. 24B. The discharge unit 3 also has an area where no opening is provided in the opening plate 330, as shown in FIG. 24C. In this area, no ink is supplied and collected between the discharge element substrate 340 and the first supporting member 4. Ink is supplied in the area where the ink supply ports 311 are provided as in FIG. 24A, and ink is collected in the area where the ink collecting ports 312 are provided as in FIG. 24B. This embodiment has been described using an example in which the opening plate 330 is used. However, the opening plate 330 may be omitted. For example, the first supporting member 4 may include channels corresponding to the ink supply channels 48 and the ink collecting channels 49, and the discharge element substrate 340 may be joined to the first supporting member 4.

Figure 25A:
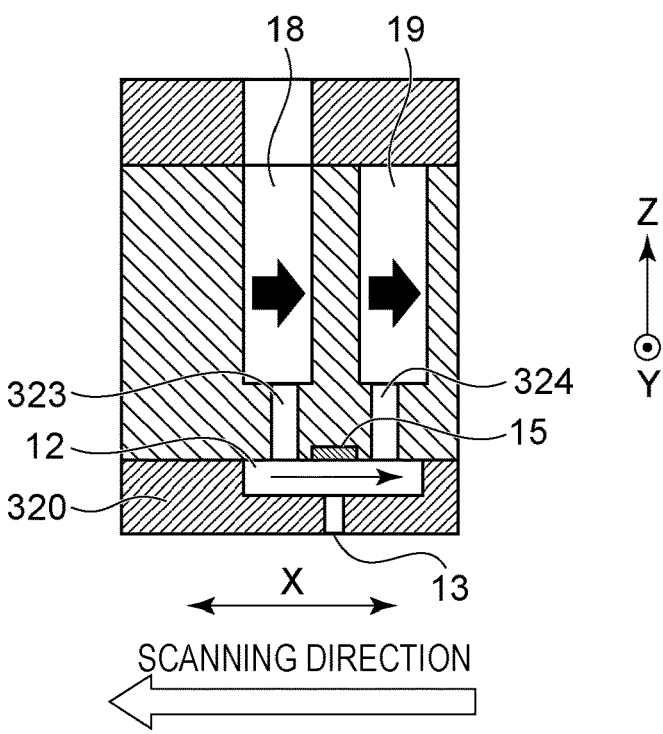
FIG. 25A is a cross-sectional view of the vicinity of the discharge port when the liquid discharge head moves in the X-direction.
Figure 25B:
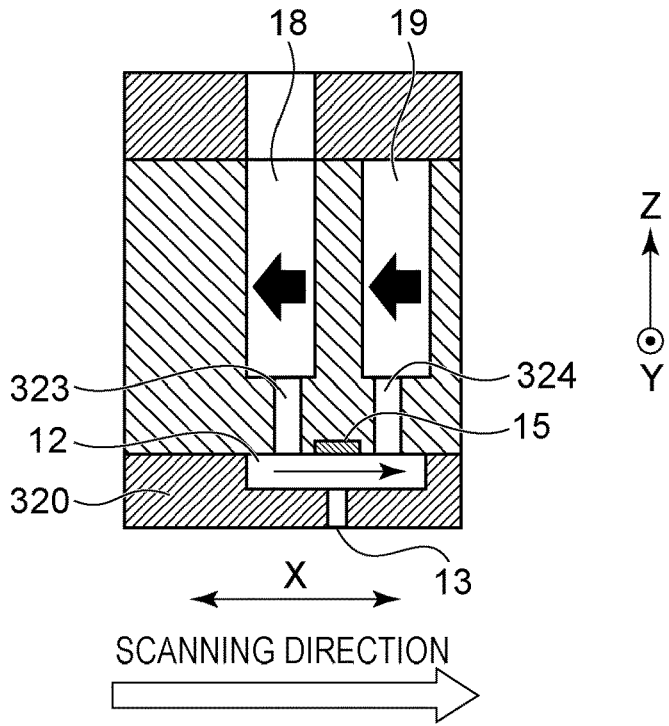
FIG. 25B is a cross-sectional view of the vicinity of the discharge port when the liquid discharge head moves in the direction opposite to the X-direction.
Figure 26A:
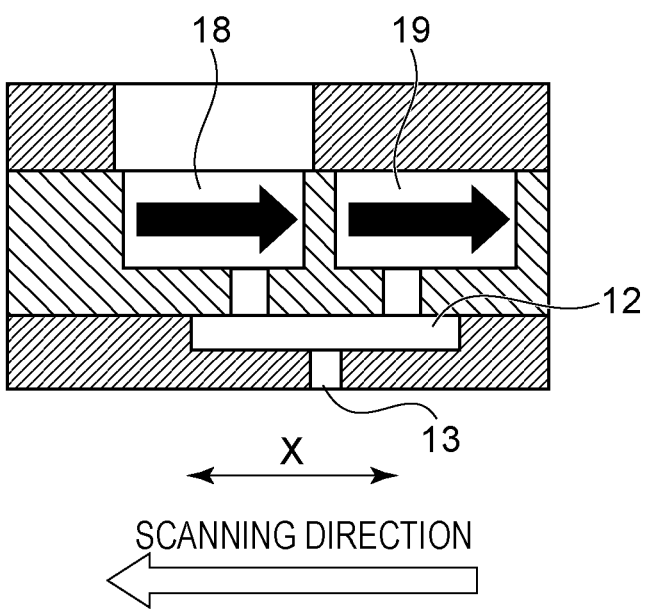
FIG. 26A is a cross-sectional view of the vicinity of the discharge port when a liquid discharge head of a comparative example moves in the X-direction.
Figure 26B:
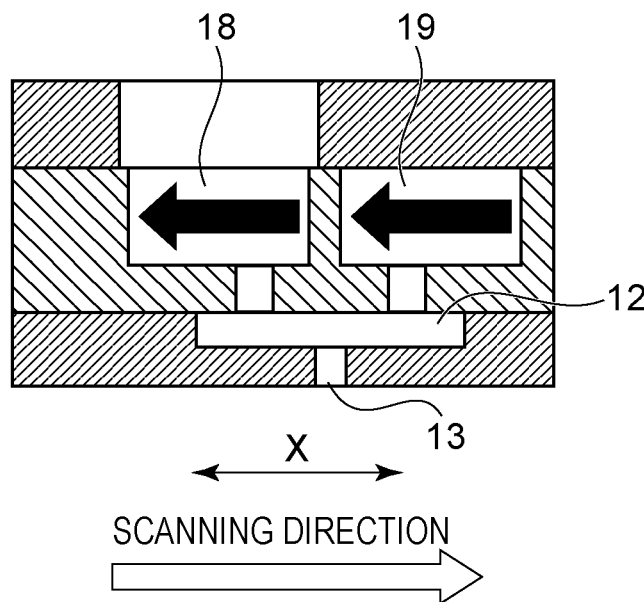
FIG. 26B is a cross-sectional view of the vicinity of the discharge port when the liquid discharge head of the comparative example moves in the direction opposite to the X-direction.

FIGS. 25A and 25B are cross-sectional views of the vicinity of the discharge port 13 of the discharge module 300. FIGS. 26A and 26B are cross-sectional views of a discharge module of a comparative example in which the common supply channel 18 and the common collecting channel 19 are expanded in the X-direction. The thick arrows shown in the common supply channel 18 and the common collecting channel 19 in FIGS. 25A and 25B and FIGS. 26A and 26B indicate the sway of ink in a configuration in which the serial liquid discharge apparatus 50 is used. The ink supplied to the pressure chamber 12 through the common supply channel 18 and the supply connecting channel 323 is discharged from the discharge port 13 by the driving of the discharge element 15. When the discharge element 15 is not driven, the ink is collected from the pressure chamber 12 to the common collecting channel 19 through the collection connecting channel 324 serving as a collecting channel.

Discharge of such circulating ink in the configuration using the serial liquid discharge apparatus 50 is affected not a little by the ink sway in the ink channel due to the scanning of the liquid discharge head 1. Specifically, the effect of the ink sway in the ink channel may cause difference in the ink discharge amount or shift in the discharge direction. In the case where the common supply channel 18 and the common collecting channel 19 have a wide cross-sectional shape in the X-direction, or the scanning direction, as shown in FIGS.

26A and 26B, the ink in the common supply channel 18 and the common collecting channel 19 are susceptible to the effect of an inertial force in the scanning direction to generate great sway in the ink. The ink sway can affect the discharge of ink from the discharge port 13. The expansion of the common supply channel 18 and the common collecting channel 19 in the X-direction may increase the distance between the colors, decreasing the efficiency of printing.

For this reason, the common supply channels 18 and the common collecting channels 19 of this embodiment extend in the Y-direction in the cross-section shown in FIGS. 25A and 25B, and extend also in the Z-direction perpendicular to the X-direction, or the scanning direction. This configuration allows the widths of the common supply channels 18 and the common collecting channels 19 in the scanning direction to be decreased. The decrease in the widths of the common supply channel 18 and the common collecting channel 19 in the scanning direction allows reduction in ink sway due to the inertial force (the thick arrows in the drawings) acting on the ink in the common supply channel 18 and the common collecting channel 19 in the direction opposite to the scanning direction during scanning. This can reduce or eliminate the effect of the ink sway on the discharge of ink. The extension of the common supply channel 18 and the common collecting channel 19 in the Z-direction increases the cross-sectional areas, thereby reducing the channel pressure loss.

Although the ink sway in the common supply channel 18 and the common collecting channel 19 is reduced by decreasing the widths of the common supply channel 18 and the common collecting channel 19 in the scanning direction, not the sway is entirely eliminated. For this reason, to prevent the difference in discharge among the ink kinds, which can be caused even by the reduced sway, this embodiment is configured such that the common supply channels 18 and the common collecting channels 19 are aligned in the Y-direction.

In this embodiment, the supply connecting channel 323 and the collection connecting channel 324 are disposed in correspondence with the discharge port 13, and the supply connecting channel 323 and the collection connecting channel 324 are disposed side by side in the X-direction, with the discharge port 13 therebetween, as described above. For this reason, if the common supply channel 18 and the common collecting channel 19 are not aligned in the X-direction, so that the correspondence relationship between the supply connecting channel 323 and the collection connecting channel 324 in the Y-direction is broken, the flow and discharge of the ink in the pressure chamber 12 in the Y-direction is affected. Additional effect of the ink sway may affect discharge of ink from each discharge port 13.

Accordingly, disposing the common supply channel 18 and the common collecting channel 19 so as to coincide in the Y-direction allows the ink sway in the common supply channel 18 and the common collecting channel 19 during scanning to be substantially equal at any position in the Y-direction in which the discharge ports 13 are arrayed. This prevents significant variations in pressure difference between the common supply channel 18 and the common collecting channel 19 in the pressure chamber 12, allowing stable discharge.

In some liquid discharge heads, channels for supplying ink to the liquid discharge heads and channels for collecting ink are the same channels. In contrast, in this embodiment, the common supply channel 18 and the common collecting channel 19 are different channels. The supply connecting channel 323 and the pressure chamber 12 communicate with each other, the pressure chamber 12 and the collection connecting channel 324 communicate with each other, and ink is discharged from the discharge port 13 of the pressure chamber 12. In other words, the pressure chamber 12 connecting the supply connecting channel 323 and the collection connecting channel 324 includes the discharge port 13. This causes an ink flow from the supply connecting channel 323 to the collection connecting channel 324 to occur in the pressure chamber 12, thereby circulating the ink in the pressure chamber 12 efficiently. The efficient circulation of the ink in the pressure chamber 12 allows the ink in the pressure chamber 12, which is susceptible to the influence of ink evaporated from the discharge port 13, to be kept fresh.

The communication of the two channels, the common supply channel 18 and the common collecting channel 19, with the pressure chamber 12 enables ink supply through both of the channels if high-flow-rate discharge is needed. In other words, the configuration of this embodiment has the advantage of being able to not only perform efficient circulation but also allowing for high discharge flow rate, as compared with a configuration in which ink supply and collection are performed using only one channel.

The common supply channel 18 and the common collecting channel 19 may be disposed close to each other in the X-direction to prevent the effect of ink sway. The interval between the common supply channel 18 and the common collecting channel 19 is preferably from 75 to 100 μm.

Figure 27:
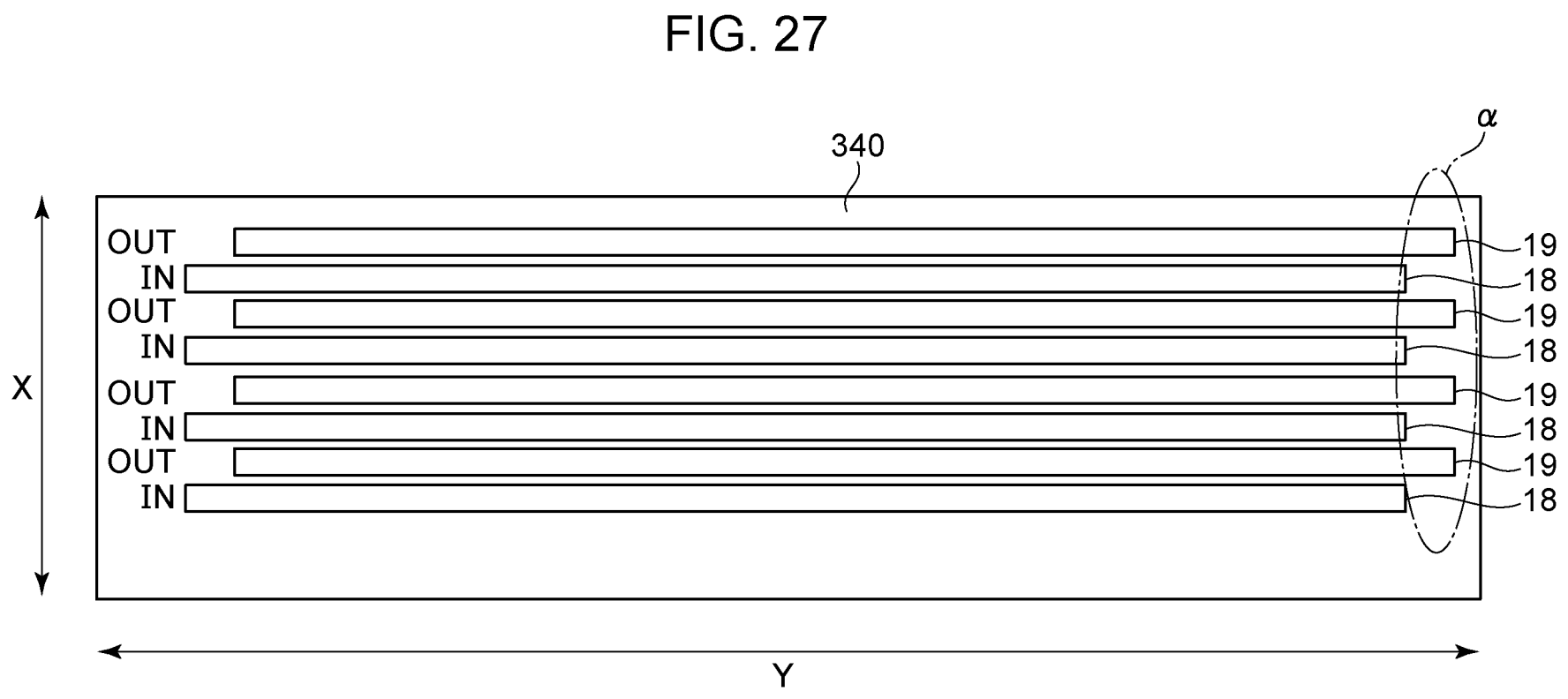

FIG. 27 is a diagram of a discharge element substrate 340 of a comparative example. In FIG. 27, the supply connecting channels 323 and the collection connecting channels 324 are omitted. Since the ink flowing into the common collecting channel 19 is subjected to thermal energy by the discharge element 15 in the pressure chamber 12, its temperature is higher than the temperature of the ink in the common supply channel 18. In the comparative example, the discharge element substrate 340 has a portion in the Y-direction, like portion a enclosed by the one-dot chain line in FIG. 27, in which only the common collecting channels 19 are present. In this case, the portion increases locally in temperature, causing temperature variations in the discharge modules 300, which may affect the discharge.

The ink flowing in the common supply channels 18 is lower than the ink in the common collecting channel 19. For this reason, disposing the common supply channel 18 and the common collecting channel 19 next to each other offsets partial temperature with the common supply channel 18 and the common collecting channel 19, thereby preventing an increase in temperature. For this reason, the common supply channels 18 and the common collecting channels 19 may have substantially the same length, may be coincide in the Y-direction and may be next to each other.

Figure 28A:
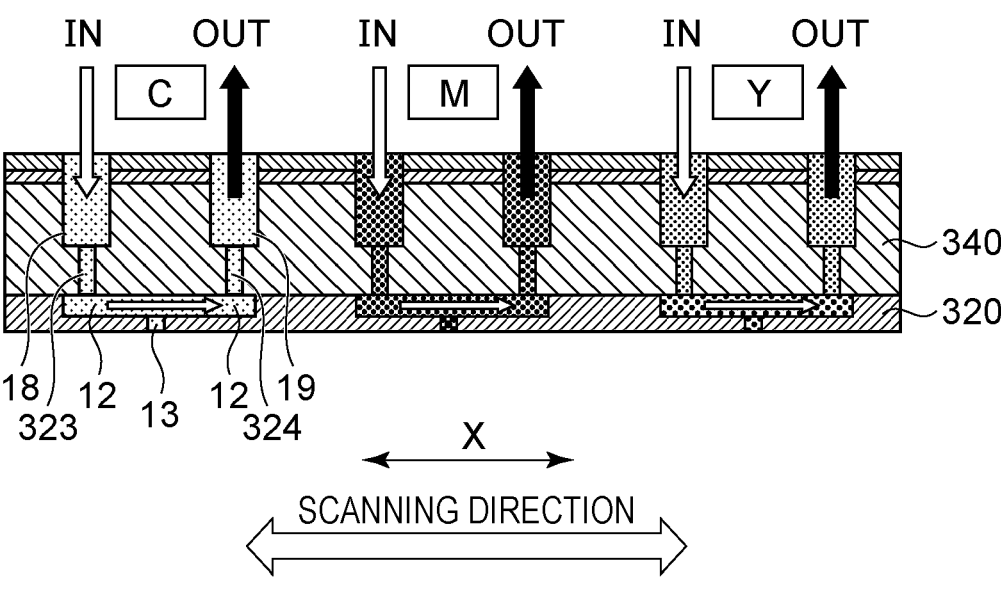
FIG. 28A is a cross-sectional view of the liquid discharge head illustrating the channel configuration thereof.
Figure 28B:
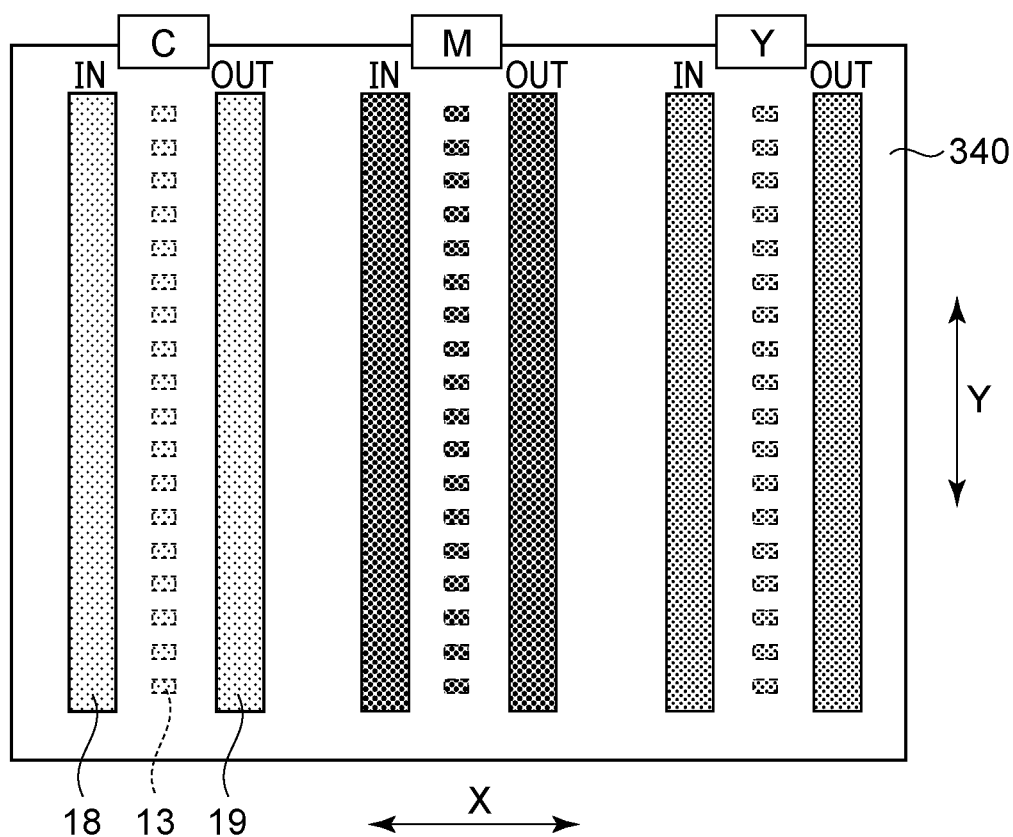
FIG. 28B is a plan view of the liquid discharge head illustrating the channel configuration thereof.

FIGS. 28A and 28B are diagrams illustrating the channel configuration of the liquid discharge head 1 for the ink of three colors, cyan (C), magenta (M), and yellow (Y). The liquid discharge head 1 includes circulating channels for the individual kinds of ink, as shown in FIG. 28A. The pressure chambers 12 are disposed in the X-direction, which is the scanning direction of the liquid discharge head 1. As shown in FIG. 28B, the common supply channels 18 and the common collecting channels 19 are disposed along the discharge port arrays in which the discharge ports 13 are arrayed, and the common supply channels 18 and the common collecting channels 19 each extend in the Y-direction, with the discharge port array therebetween.

Installing the piezoelectric pump 500 described in the above embodiment in the liquid discharge head 1 allows liquid to be circulated in the liquid discharge head 1. In particular, if the discharge elements 15 that generate energy to heat the liquid for discharge is installed, the ink that has circulated in the liquid discharge head 1 is heated, and high-temperature ink flows into the piezoelectric pump 500. Integrating the piezoelectric pump 500 with the liquid discharge head 1 to decrease the length of the channel connecting the liquid discharge head 1 and the piezoelectric pump 500 may reduce, in particular, heat discharge, causing high-temperature ink to flow into the piezoelectric pump 500. The inflow of the high-temperature ink to the piezoelectric pump 500 accelerates the diffusion of the ink component from the pump chamber 503 through the adhesive interface of the diaphragm 506, making separation of the adhesive interface of the adhesive 508 likely to occur. For this reason, the use of the urging member 514 for urging the piezoelectric member 510 or the metal plate 509 toward the diaphragm 506 as in this embodiment allows preventing separation of the adhesive interface of the adhesive 508. Accordingly, this embodiment is more suitable for the thermal method.

Also for liquid discharge heads that discharge liquid using piezoelectric elements, the substrate including a driving integrated circuit (ID) for driving the piezoelectric elements generates heat. For this reason, this embodiment is also suitable for piezoelectric liquid discharge heads in which the circulation path is at a position affected by the heat from the drive IC.

Having described a liquid discharge apparatus including the liquid discharge head 1 with the piezoelectric pump 500, the piezoelectric pump 500 may be disposed outside the liquid discharge head 1 and in the casing of a liquid discharge apparatus. In this case, the piezoelectric pump 500 circulates the liquid in the liquid discharge head 1 with the piezoelectric pump 500. The distance between the piezoelectric pump 500 and the discharge ports 13 reduces the effect of the pulsation of the piezoelectric pump 500 on the discharge stability.

With the above configuration, providing the piezoelectric pump 500 of this embodiment for the liquid discharge head 1 enables the liquid discharge head 1 to circulate liquid at a stable flow rate for a long period of time. Installing the liquid discharge head 1 including the piezoelectric pump 500 in a liquid discharge apparatus enables the liquid discharge apparatus to circulate liquid at a stable flow rate for a long period of time.

Combinations of the configurations of the above embodiments are also applicable.

According to embodiments of the present disclosure, a piezoelectric pump in which separation of the adhesive interface of an adhesive that bonds a diaphragm and a piezoelectric member or a metal plate and a diaphragm together can be prevented, and a liquid discharge head and a liquid discharge apparatus including such a piezoelectric pump can be provided.

While the present disclosure has been described with reference to embodiments, it is to be understood that the disclosure is not limited to the disclosed embodiments. The scope of the following claims is to be accorded the broadest interpretation so as to encompass all such modifications and equivalent structures and functions.

This application claims the benefit of priority from Japanese Patent Application No. 2022-038934, filed Mar. 14, 2022, which is hereby incorporated by reference herein in its entirety.

What is claimed is:

1. A liquid discharge head comprising:
a discharge port that discharges liquid;
a discharge element that generates energy for discharging the liquid from the discharge port;
a pressure chamber in which the discharge element is disposed;
a first channel connected to the pressure chamber to supply the liquid to the pressure chamber;
a second channel connected to the pressure chamber; and
a piezoelectric pump that makes the liquid in the second channel flow into the first channel;
wherein the piezoelectric pump includes:
a piezoelectric member driven by application of a voltage;
a diaphragm deformed by driving of the piezoelectric member;
an adhesive member bonding the piezoelectric member and the diaphragm together;
an urging member that urges the piezoelectric member toward the diaphragm; and
a drive circuit board, and
wherein a gap between the drive circuit board and the piezoelectric member is set shorter than a free length of the urging member.

2. The liquid discharge head according to claim 1, wherein the discharge element generates energy for discharging the liquid by heating the liquid.

3. The liquid discharge head according to claim 1, further comprising a bypass channel that communicates between the first channel and the second channel not via the pressure chamber.

4. The liquid discharge head according to claim 3,
wherein the second channel includes a second pressure adjusting unit that adjusts pressure of the liquid in the second channel, and
wherein one end of the bypass channel communicates with the second pressure adjusting unit.

5. The liquid discharge head according to claim 1, further comprising:
an inflow channel through which the liquid to be supplied to the pressure chamber flows into the first channel,
wherein the first channel includes a first pressure adjusting unit that adjusts pressure of the liquid in the first channel,
wherein the inflow channel is connected to the first channel, and
wherein the first pressure adjusting unit communicates with the inflow channel.

6. The liquid discharge head according to claim 1,
wherein the piezoelectric pump includes a drive circuit board, and
wherein the urging member is fixed to the drive circuit board.

7. The liquid discharge head according to claim 1, wherein the urging member comprises an elastic member.

8. The liquid discharge head according to claim 1, wherein the elastic member comprises a spring member.

9. The liquid discharge head according to claim 1, further comprising:
a supporting member supporting the diaphragm, the supporting member and the diaphragm forming a pump chamber therebetween;
a supply port communicating with the pump chamber to supply liquid to the pump chamber; and
a discharge port communicating with the pump chamber to discharge the liquid in the pump chamber, wherein, in use, the pump chamber extends in a vertical direction, and the discharge port is disposed higher than the supply port.

10. The liquid discharge head according to claim 1, wherein, in use, the discharge port is disposed higher than a center of a pump chamber in a vertical direction.

11. A liquid discharge head comprising:
a discharge port that discharges liquid;
a discharge element that generates energy for discharging the liquid from the discharge port;
a pressure chamber in which the discharge element is disposed;
a first channel connected to the pressure chamber to supply the liquid to the pressure chamber;
a second channel connected to the pressure chamber; and
a piezoelectric pump that makes the liquid in the second channel flow into the first channel;
wherein the piezoelectric pump includes:
    a piezoelectric member driven by application of a voltage;
    a diaphragm deformed by driving of the piezoelectric member;
    an adhesive member bonding the piezoelectric member and the diaphragm together;
    an urging member that urges the piezoelectric member toward the diaphragm; and
    a metal plate fixed to the piezoelectric member, and
wherein the adhesive member bonds the piezoelectric member and the diaphragm together via the metal plate.

12. The liquid discharge head according to claim 11, wherein the metal plate has a larger area than the piezoelectric member.

13. The liquid discharge head according to claim 11, wherein the piezoelectric member, the metal plate, the adhesive member, and the diaphragm are disposed in this order, and
wherein the urging member urges the metal plate toward the diaphragm via the piezoelectric member.

14. The liquid discharge head according to claim 11, wherein a gap between the drive circuit board and the metal plate is shorter than the free length of the urging member.

15. A liquid discharge head comprising:
a discharge port that discharges liquid;
a discharge element that generates energy for discharging the liquid from the discharge port;
a pressure chamber in which the discharge element is disposed;
a first channel connected to the pressure chamber to supply the liquid to the pressure chamber;
a second channel connected to the pressure chamber;
a piezoelectric pump that makes the liquid in the second channel flow into the first channel;
wherein the piezoelectric pump includes:
    a piezoelectric member driven by application of a voltage;
    a diaphragm deformed by driving of the piezoelectric member;
    an adhesive member bonding the piezoelectric member and the diaphragm together;
    an urging member that urges the piezoelectric member toward the diaphragm;
    a metal plate fixed to the piezoelectric member; and
    a drive circuit board configured to apply a voltage to the piezoelectric member,
wherein the urging member includes a first urging member and a second urging member that contain an electrically conductive material and that electrically connect with the drive circuit board, and
wherein the first urging member urges the piezoelectric member toward the metal plate, and the second urging member urges the metal plate toward the diaphragm.

16. The liquid discharge head according to claim 15, wherein the first urging member has a diameter less than a diameter of the piezoelectric member, and
wherein the second urging member has a diameter greater than the diameter of the piezoelectric member and less than a diameter of the metal plate.

17. The liquid discharge head according to claim 15, wherein the first urging member and the second urging member are fixed and connected to the drive circuit board.

* * * * *